US 7,724,100 B2

(12) United States Patent
Gong et al.

(10) Patent No.: US 7,724,100 B2
(45) Date of Patent: May 25, 2010

(54) OSCILLATOR STRUCTURE

(75) Inventors: Xiaowu Gong, Singapore (SG); Kok Kee Lim, Singapore (SG); Junyang Luo, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 114 days.

(21) Appl. No.: 11/669,539

(22) Filed: Jan. 31, 2007

(65) Prior Publication Data
US 2008/0180151 A1    Jul. 31, 2008

(51) Int. Cl.
H03K 3/26 (2006.01)
(52) U.S. Cl. .......................... 331/111; 331/46; 331/49; 331/55; 331/113; 331/143; 331/145; 331/149; 331/153; 331/175; 327/175
(58) Field of Classification Search .................. 331/46, 331/49, 55, 111, 143, 175, 145, 149, 153, 331/113; 327/175
See application file for complete search history.

(56) References Cited

U.S. PATENT DOCUMENTS

| 5,394,020 | A | * | 2/1995 | Nienaber | 327/140 |
| 5,572,554 | A | * | 11/1996 | Heflin | 375/356 |
| 5,815,045 | A | * | 9/1998 | Koyanagi et al. | 331/143 |
| 6,052,035 | A | * | 4/2000 | Nolan et al. | 331/74 |
| 6,177,845 | B1 | * | 1/2001 | Moll | 331/49 |
| 6,369,665 | B1 | * | 4/2002 | Chee et al. | 331/143 |
| 6,435,037 | B1 | * | 8/2002 | Doten | 73/861.27 |
| 6,518,809 | B1 | * | 2/2003 | Kotra | 327/175 |
| 6,539,316 | B1 | * | 3/2003 | Doten et al. | 702/48 |
| 6,850,101 | B1 | * | 2/2005 | De Stasi | 327/141 |
| 6,900,701 | B2 | * | 5/2005 | Chan | 331/74 |
| 6,976,185 | B1 | * | 12/2005 | Plants et al. | 713/500 |
| 7,173,495 | B1 | * | 2/2007 | Kenny et al. | 331/49 |
| 7,196,589 | B1 | * | 3/2007 | Silva et al. | 331/49 |
| 7,298,193 | B2 | * | 11/2007 | Agarwal et al. | 327/175 |
| 7,307,481 | B1 | * | 12/2007 | Bell et al. | 331/49 |
| 7,408,420 | B2 | * | 8/2008 | Wong et al. | 331/49 |
| 2002/0075982 | A1 | * | 6/2002 | Doblar | 375/376 |

* cited by examiner

Primary Examiner—Arnold Kinkead
Assistant Examiner—Richard Tan
(74) Attorney, Agent, or Firm—Eschweiler & Associates, LLC

(57) ABSTRACT

An oscillator structure has a sync signal processor with an input interface for an external clock based sync signal and an output interface for a duty cycle indication signal depending on a signal property of the sync signal and an oscillator with an input interface for the duty cycle indication signal and the sync signal and an output interface for an oscillation signal synchronized with the external clock and having a duty cycle adjusted according to the duty cycle indication signal.

24 Claims, 16 Drawing Sheets

Simulation result for conventional transition from synchronization oscillator to internal oscillator or from internal oscillator to synchronization oscillator

OSCILLATOR STRUCTURE

TECHNICAL FIELD

The present invention relates to oscillator structures.

BACKGROUND

Oscillator structures oscillating in synchronization to an external clock signal are widely used. These are, for example, used to generate a signal having a predetermined duty cycle, i.e. a predetermined constant ratio between it's active ("1") and it's inactive ("0") phase. It is furthermore desirable that these oscillator structures are synchronized to the external clock signal, i.e. that the active phase at the oscillator structure output occurs at the same time or with fixed predetermined delay to the begin of the active phase of the clock signal, on which the oscillator structure is to be synchronized.

In the design phase of active circuits, it is often desirable to have access to adjustable oscillator structures, as then it might be possible to use the same oscillator structure (IC) for different design goals, instead of having to create an oscillator, which is specifically tailored to a unique circuit.

SUMMARY

According to an embodiment, an oscillator structure may comprise a sync signal processor comprising an input interface for an external clock based sync signal and an output interface for a duty cycle indication signal depending on a signal property of the sync signal; and an oscillator comprising an input interface for the duty cycle indication signal and the sync signal and an output interface for an oscillation signal synchronized with the external clock and having a duty cycle adjusted according to the duty cycle indication signal.

BRIEF DESCRIPTION OF THE DRAWINGS

Different embodiments will in the following be briefly described, referencing the enclosed figures.

DETAILED DESCRIPTION

Figure 1:
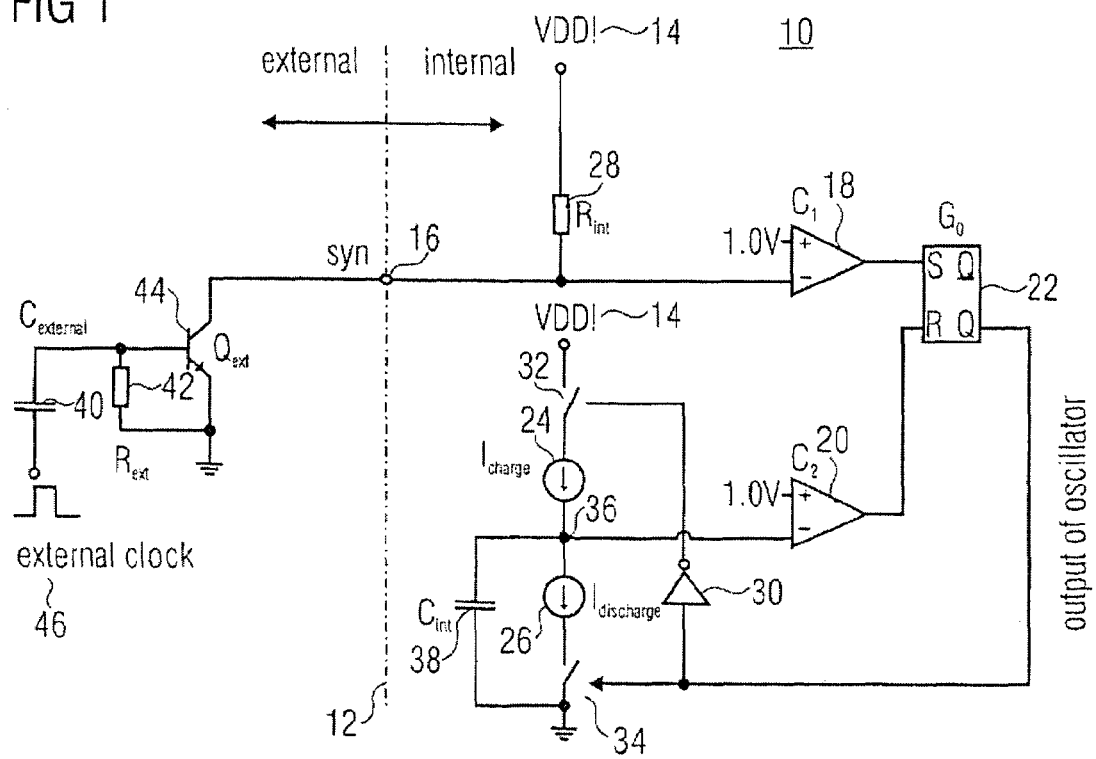
FIG. 1 shows an example of an oscillator structure.

According to an embodiment, an oscillator structure can be provided allowing to extend the accessible duty cycle range up to 1. This can be achieved, according to an embodiment, by introducing a second oscillator within an oscillator structure comprising a first oscillator, wherein the second oscillator is run such as to double the duty cycle of the first oscillator being in synchronization to an external clock signal. In other words, a first oscillator is used comprising an input interface for the sync signal and an output interface for an intermediate oscillation signal having a duty cycle adjusting according to a duty cycle indication signal, which may be used to adjust the duty cycle in the range of [0, . . . , 0.51. Furthermore, according to an embodiment, a second oscillator circuit comprising an input interface for the sync signal and intermediate oscillation signal and an output interface for the oscillation signal synchronized with the external clock and having a duty cycle being twice the value of the duty cycle of the first oscillator can be used.

According to another embodiment, an oscillator structure may provide the possibility to switch between two different duty cycles using the same input pin already used for the external clock signal to be synchronized upon. To this end, according to an embodiment, external circuitry may be used to choose between two different possible duty cycles. According to an embodiment, this can be achieved by using two or more different voltage levels applied at the input receiving the clock signal. According to an embodiment, the oscillator structure may comprise a sync signal processor steering the oscillator in dependence on the sync signal such, that the oscillator may be switched between two or more duty cycles, as indicated by the voltage level. In other words, according to an embodiment of the oscillator structure, a sync signal processor comprising an input interface for an external clock based sync signal and an output interface for a duty cycle indication signal depending on a signal property of the sync signal can be used. Furthermore, according to an embodiment, an oscillator comprising an input interface for the duty cycle indication signal and the sync signal can be used, having an output interface for an oscillation signal synchronized with the external clock and having a duty cycle adjusted according to the duty cycle indication signal. According to an embodiment, the signal property of the sync signal used by the sync signal processor can be the voltage level of the sync signal.

According to a further embodiment, an oscillator structure may comprise a switching time calculator for calculation of a switching time such that, in a transition phase between a first and second oscillator of the oscillator structure, the duty cycle will neither exceed the duty cycle of the first nor of the second oscillator. In other words, one embodiment of the oscillator structure may comprise a switching time calculator comprising an input interface for an oscillator selection signal and an output interface for a transition time signal, such that a combined oscillation signal combined concatenating the oscillation signals of the first oscillator or the second oscillator and the oscillation signal of the oscillator indicated by the oscillator selection signal at a time indicated by the transition time signal has a duty cycle below a predetermined duty cycle threshold.

According to a further embodiment, an oscillator structure may comprise a sync signal processor, further comprising an output interface for a frequency indication signal depending on a signal property of the sync signal. According to an embodiment, an internal oscillator within the oscillator structure further may comprise an input interface for the frequency indication signal, wherein the frequency of the oscillation signal of the internal oscillator depends on the frequency indication signal.

In a further embodiment, a signal property evaluated by the sync signal processor for creating the frequency indication signal can be the current of the sync signal. In a further embodiment, the current to be evaluated can be applied to the clock signal, such that both functionalities may be achieved using only one single pin of an IC.

According to a further embodiment, the current may be varied by applying different external circuitry to the oscillator structure. In yet a further embodiment, the current may also be switched between two different current ranges to signal the desired use of different duty signals of a further oscillator within the oscillator structure, which is running in synchronization to an external clock signal and which is able to provide for two different duty cycles. That is, three functionalities may be selected using one single signal line (one single pin of an IC), wherein the selection may be completely done using different external circuit components, such as different resistors or the like.

FIG. 1 shows an example of an oscillator structure, used to generate an oscillation signal with a predetermined duty cycle, which is synchronized with an externally applied clock signal. FIG. 1 is a block diagram for a synchronization oscillator 10. The oscillator structure (synchronization oscillator) 10 could, for example, be implemented into an IC. The circuit elements forming the actual oscillator 10 are separated from external circuitry by a dashed line 12, separating a possible IC from the external circuitry. An example for external elements applying a clock signal as a sync signal are also given.

According to an embodiment, the oscillator structure 10 comprises an internal operating voltage 14, an input interface for a sync signal 16, a first comparator 18, a second comparator 20 and a flip-flop 22. Furthermore, the oscillator structure 10 comprises a first current source 24 and a second current source 26.

According to an embodiment, an internal resistor 28 is coupled between the internal operating voltage 14 and the input interface for the sync signal 16, which is furthermore connected the inverting input of the first comparator 18. The output of the first comparator 18 is coupled to the "set" input of flip-flop 22. The non-inverted output Q of the flip-flop 22 is connected, via an inverter 30, to a first switch 32 and furthermore coupled directly to a second switch 34. The coupling to the switches is such, that the switches are closed when the applied switching voltage is in it's "high" state. The first switch 32 is connected to the internal operating voltage 14 and furthermore to the first current source 24, which is furthermore connected to a first connection point 36. The second current source 26 is also connected to the first connection point and furthermore switchable to ground via the second switch 34. A capacitor 38 is switched between ground and the first connection point 36. The first connection point 36 is furthermore connected to the inverting input of the second comparator 20. The non-inverting inputs of the first comparator 18 and the second comparator 20 are connected to a reference voltage, which could, for example, be 1.0 V.

According to an embodiment, the external circuitry comprises an external capacitor 40, and external resistor 42 and an external transistor 44. The external capacitor 40 is placed between an external clock signal 46 and the base of the external transistor 44. The external resistor 42 is placed between the base of the external transistor 44 and ground, the emitter of the external transistor 44 is connected to ground, whereas the collector of the external transistor is connected to the input interface for the sync signal 16 of the oscillator structure 10.

Figure 2:
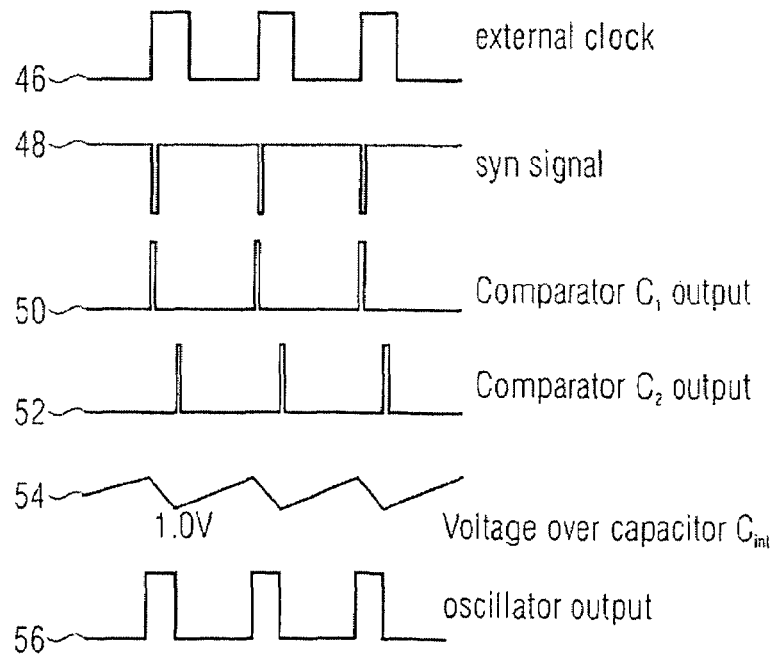
FIG. 2 shows a timing diagram for the example of an oscillator structure of FIG. 1.

FIG. 2 shows timing diagrams for voltage signals of particular interest of the oscillator structure 10. Therefore, the functionality of the oscillator structure will in the following be described referencing also the timing diagrams of FIG. 2, showing the signals within the oscillator structure 10. It may furthermore be noted, that the oscillator structure 10 is intended to oscillate in synchronization with an external clock signal 46. Therefore, for the following short description of the oscillator structure 10, a valid external clock signal is assumed to be applied to the external capacitor 40.

FIG. 2 shows the external clock signal 46 applied to the external capacitor 40. FIG. 2 furthermore shows an associated sync signal as observable at the input interface for sync signal 16, a first comparator output signal 50 of the output of the first comparator 18 and a second comparator output signal 52 of the output of the second comparator 20. Furthermore, a capacitor voltage 54 is illustrated, as observed at capacitor 38. Finally, the oscillator output 56 is illustrated, as for example occurring at the non-inverting output of the flip-flop 22.

Upon occurrence of a rising edge of the external clock signal 46, the high-path formed by the external capacitor 40 and the external resistor 42 causes a voltage difference between the base and the emitter of the external transistor 44 to occur for a time corresponding to the specific timescale of the high-path. Therefore, the external transistor 44 becomes conducting for that (short) time. Thus, for that time current will flow through the internal resistor 28, causing a short-time voltage drop at the input interface for the sync signal 16 and thus at the inverting input of the first comparator 18. Provided the voltage dimensions are chosen correctly, the first comparator output signal 50 will become positive for the time period defined by the external high-path. Therefore, in synchronization with the leading edge of comparator output signal 50, the non-inverting output of flip-flop 22 will become high, as illustrated by oscillator output voltage 56. Due to the coupling of switches 24 and 34, the first current source 24 will be disconnected from the internal operating voltage 14 and the second current source 26 will be connected to ground simultaneously. Therefore, capacitor 38 starts being discharged by the second current source 26.

However, discharging stops when the capacitor voltage 54 falls underneath a threshold voltage (in this example 1.0 V) of the second comparator 20. At that very moment, the second comparator output signal 52 becomes positive and thus resets flip-flop 22. Resetting flip-flop 22 means causing the oscillator output signal 56 (non inverting output of flip flop 22) to become low, thus defining the duty cycle of the oscillator structure 10. Then, capacitor 38 will be charged until the flip-flop 22 is set again, starting another cycle. In other words, the duty cycle is predetermined by the current of the first current source 24 and the second current source 26 and the clock frequency of the external clock 46.

To summarize, FIGS. 1 and 2 show a block diagram for a synchronization oscillator. External components are used to send a synch-signal into the oscillator structure 10 (IC). Inside the oscillator structure, a capacitor 38 ($C_{int}$) is used to be charged or discharged and to generate the oscillator signal. The flip-flop 22 is used to control charge-or-discharge operation and which is furthermore set by the sync signal 48 and reset by the second comparator output signal 52 of the second comparator 20.

The wave forms or timing-diagrams of FIG. 2 show how the synchronization oscillator works. An external clock can be sent into the chip by a sync signal only sensing the rising edge of the external clock. The flip-flop 22, which is used to control charging and discharging current is set by the rising edge of the external clock and reset by the output of the internal second comparator 52. The capacitor voltage 54 occurring over the capacitor 38 is a ramp voltage between two levels. One level is fixed (lower side) according to the reference voltage of the second comparator 20 (i.e. 1.0 V), while the other level (upper level) is not fixed and depends on the frequency of the external clock signal 46 (higher frequency results in a lower level). Therefore, the oscillator structure 10 is synchronized to the external clock signal, that is, it's frequency is determined by the external clock, while it's duty cycle is controlled by an internal selection, i.e. the current sources 24 and 26.

Figure 3:
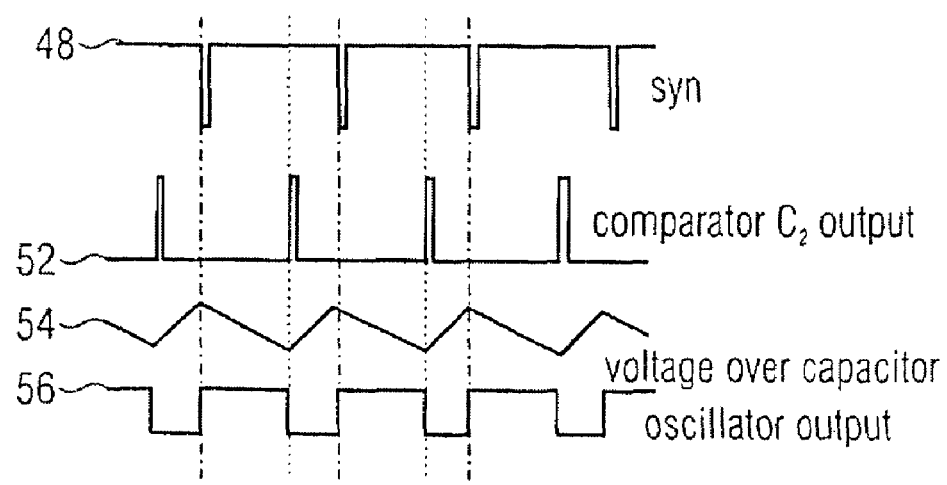
FIG. 3 shows a detailed timing diagram for the example of an oscillator structure of FIG. 1.

As previously described, the upper voltage level of the capacitor is variable and depending on the frequency of the external clock signal 46 and the first current source 24. Therefore, oscillator structure 10 has some limits. The limits are based on the fact that the charging current must be lower than the discharging current to guarantee that the voltage over the capacitor returns back to 1.0 V (fixed side) in each cycle for every possible frequency of the clock signal. Otherwise, the oscillator would be unstable as the voltage over the capacitor 38 could eventually increase without a limit. This automatically implies that the duty cycle will be less than 50%. In other words, duty cycles of more than 50% are not achievable with the oscillator structure 10. This becomes evident, when FIG. 3 is considered, showing the only possible solution as to how the duty cycle of the oscillator output 56 might be constructed to become more than 0.5. When the sync signal 48 defines the rising edge of the internal oscillator output, that is the beginning of the discharge capacitor 38, a duty cycle of more than 50% (as illustrated in FIG. 3) can only be achieved by choosing the charging current to be higher than the discharging current, which is not feasible since it results in instability of the oscillator structure. This instability may occur when the sync signal 48, i.e. the clock frequency, is further decreased with respect to the stable situation of FIG. 3. Then, the charge interval will become longer such that the capacitor voltage 54 over the capacitor 38 would become that high, that it could no longer be discharged to reach the comparator level of the second comparator 20.

Even if a desired duty cycle would be less than 50% but very close to 50%, using an oscillator structure 10 with a sync signal 48 defining the rising edge of an internal oscillator output, problems may occur. This is the case, since near 50% duty cycle, the charging current will be only slightly lower than the discharging current such that instability may occur because of process spread in the production of the integrated circuit or the discrete elements.

Figure 4:
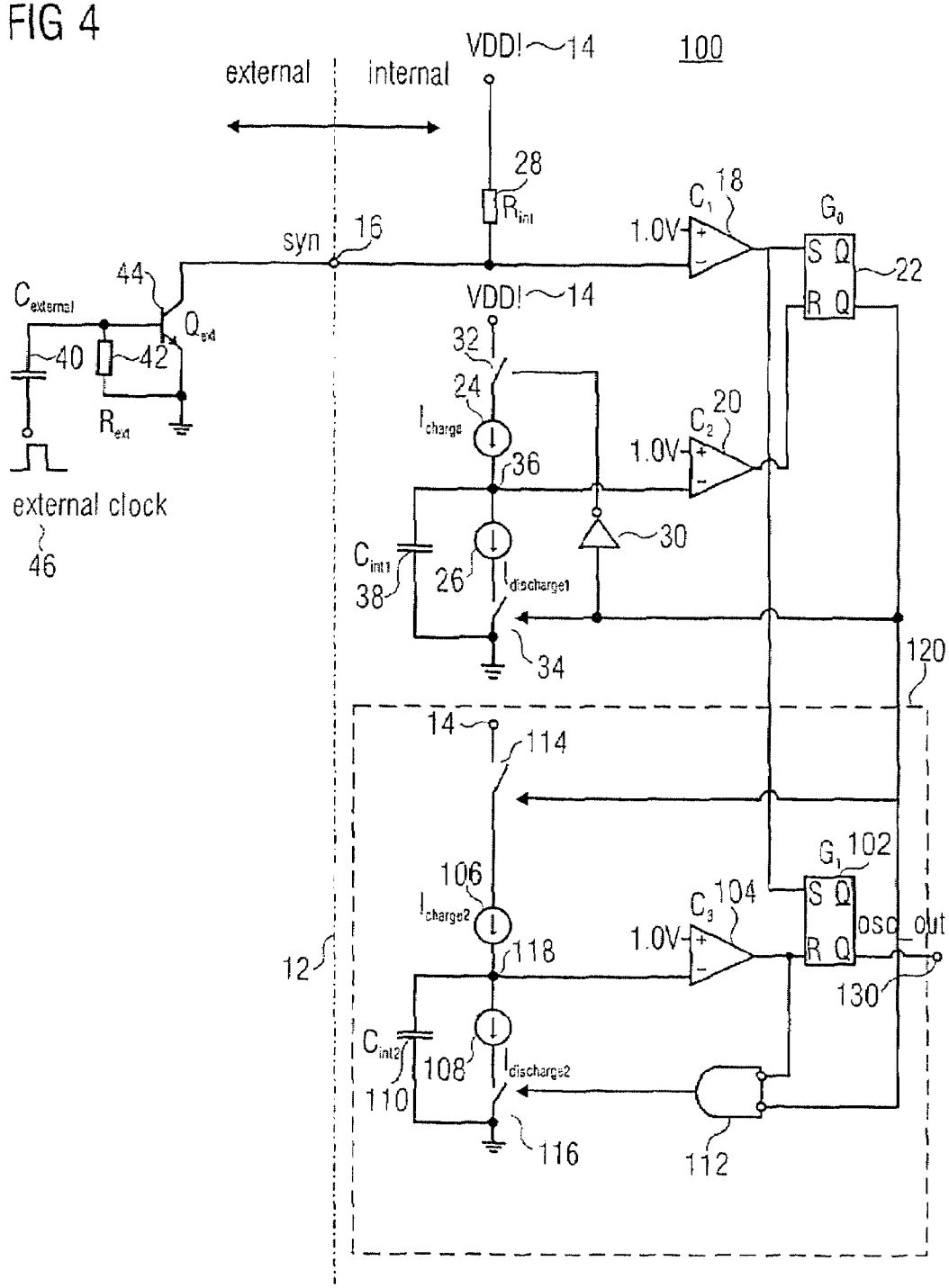
FIG. 4 shows an example of an oscillator structure.
Figure 5:
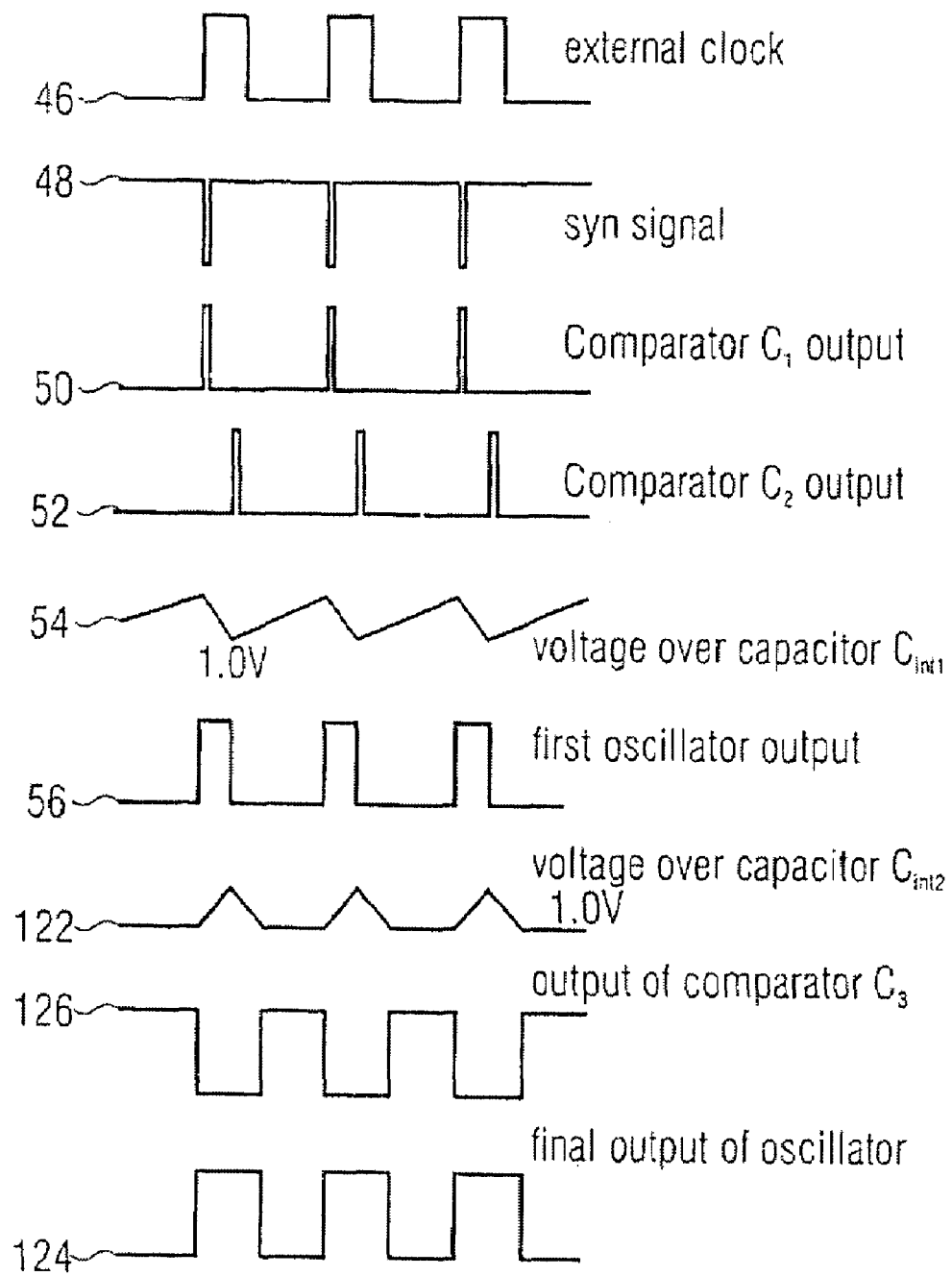
FIG. 5 shows a timing diagram of the example of the oscillator structure of FIG. 4.

FIG. 4 shows an example of an oscillator structure 100 as one embodiment. In the following, FIG. 4 shall be explained referencing also FIG. 5, showing numerous timing diagrams for certain signals occurring in the oscillator structure 100 of FIG. 4.

According to an embodiment, the oscillator structure 100 is based on the oscillator structure 10 of FIG. 1. Hence, identical components share the same reference numbers and their description or the description of individual components sharing the same functionality may be applied to FIG. 1 as well as to FIG. 4 and the further figures having the same elements.

Consequently, the components already described in FIG. 1 are not repeatedly described in the description of the oscillator structure 100.

According to an embodiment, the oscillator structure 100 does further comprise a second flip-flop 102, a third comparator 104, a third current source 106 and a fourth current source 108. The oscillator structure 100 furthermore comprises a second capacitor 110 and an and gate 112. Furthermore, a third switch 114 and a fourth switch 116 are present.

According to an embodiment, the non-inverting output of the flip-flop 22 is connected to the third switch 114 and to a first input of the and gate 112. Furthermore, the output of the first comparator 18 is connected to the set-input of the second flip-flop 102. The output of the third comparator 104 is connected to the reset input of the flip-flop 102 and to the second input of the and gate 112. The output of the and gate 112 is connected to the fourth switch 116, which is switched between the fourth current source and ground. The fourth current source 108 is furthermore connected to a second connection point 118. The second capacitor 110 is switched between ground and the second connection point 118, which is furthermore connected to the inverting input of the third comparator 104. The third current source 106 is switched between the second connection point 118 and the third switch 114, which is furthermore connected to the internal operating voltage 14 to possibly connect the third current source 106 to the internal operating voltage 14, depending on the signal at the non-inverting output of the flip-flop 22.

As described in more detail below, the oscillator structure 100 is basically based on the oscillator structure 10 and extended with a second oscillator circuit 120, doubling the duty cycle of the oscillator structure 10, which in may also be referred to as first oscillator circuit in the context of the oscillator structure 100.

As shown in the timing diagrams of FIG. 5, the second capacitor 110 starts being loaded together with the start of the discharge phase of capacitor 38, since the associated switches 34 and 114 are set simultaneously, depending on the output signal of the first comparator. That is, a second capacitor voltage 122 starts to rise, i.e. the second capacitor 110 is being loaded, when the capacitor 38 starts being unloaded.

Since the output of the first comparator 18 is furthermore coupled to the set-input of the second flip-flop 102, a final oscillator output signal 124 is set to "high" at the same time, i.e. in synchronization with the clock signal 46. While charging, the voltage at the inverting input of the third comparator 104, i.e. the second capacitor voltage 122, is above the threshold of the third comparator 104, hence a third comparator output voltage 126 is low.

The very moment the oscillator output 56 becomes low (i.e. the first oscillator structure has finished it's cycle), the non-inverted output of the first flip-flop 22 is set low. That is, the third switch 114 is opened and at the same time, the first input to the and gate 112 becomes high due to the inversion of the signal at the inputs of the and gate 112. At the same time, the second input to the and gate 112 is also high, as previously discussed. Therefore, the fourth switch 116 is closed, starting to discharge the second capacitor 110, i.e. ramping down the second capacitor voltage 122 as illustrated in FIG. 5.

When the third and the fourth current sources 106 and 108 deliver the same current, the second capacitor voltage 122 will fall below the threshold of the third comparator 104 after precisely the same time interval used for charging the second capacitor 110. Hence, the second flip-flop 102 is reset precisely after twice the time the oscillator output 56 is high. That is, the duty cycle of the final oscillator output signal 124 provided at an oscillator output 130 (the non-inverting output of the second flip-flop 102) is effectively doubled.

In other words, according to this embodiment, two oscillator circuits are used to build an oscillator structure and to implement a synchronization oscillator. A first oscillator achieves half the final duty cycle, whereas a second oscillator doubles the pulse-width of the first duty cycle, such that a final oscillator output signal comes out. If, for example, the target duty cycle was 68%, the first oscillator would be designed to have a duty cycle of 34% such that the second oscillator doubles the duty cycle to finally achieve the desired 68% duty cycle.

This embodiment of an oscillator structure has the great advantage that no instability may occur, when the required duty cycle is above 50%. The stability problems are overcome by the duty cycle doubling, because the first oscillator can always be operated with a charging current that is lower than the discharging current. That is, it can well be synchronized with the external clock signal and may have a duty cycle set internally by the first and the second current sources 24 and 26. The prevention of the possible instability limits conventional oscillators to duty cycles below 50%, which is overcome within this embodiment by the introduction of a second oscillator, doubling the duty cycle. Coming back to the duty cycle of 68%, the first oscillator should be designed to have a duty cycle of 34%. Because 34% is smaller than 50%, charging time is longer than discharging time, so charging current is smaller than discharging current. As such, the first oscillator circuit is stable and can be easily implemented. The second oscillator structure differs from the first one in that it has three phases: a charging phase, a discharging phase and a holding phase. During the charging phase the second capacitor 110 ($C_{int2}$) is charged from holding voltage (for example 1.0 V) to a higher level in a period as long as the first oscillator structure's duty cycle of 34%. That is, second oscillator circuit 120 will charge the second capacitor 110 during the duty cycle period (34%) of the first oscillator structure. To double the duty example 1.0 V) to a higher level in a period as long as the first oscillator structure's duty cycle, the same discharging current as charging current is needed in the discharging phase, which ends, when the voltage over the second capacitor 110 ($C_{int2}$) reaches the holding voltage (1.0 V in the example of before). Because charging and discharging currents are the same, discharging time will be the same as charging time. When the voltage over the second capacitor 110 is discharged to be less than the holding voltage, the second oscillator structure will go into the holding period. During the holding period, there is no charging current or discharging current. Voltage will remain unchanged until entering the charging period for the next time.

Although it has been proposed to use the same charging and discharging current within the second oscillator structure 120, further embodiments use different charging and discharging currents to provide for an even more enhanced flexibility.

There may also be the need to provide an oscillator structure allowing to use different duty cycles and being synchronized with an external clock signal. This may be achieved according to a further embodiment, as described in FIGS. 6 and 7.

Figure 6:
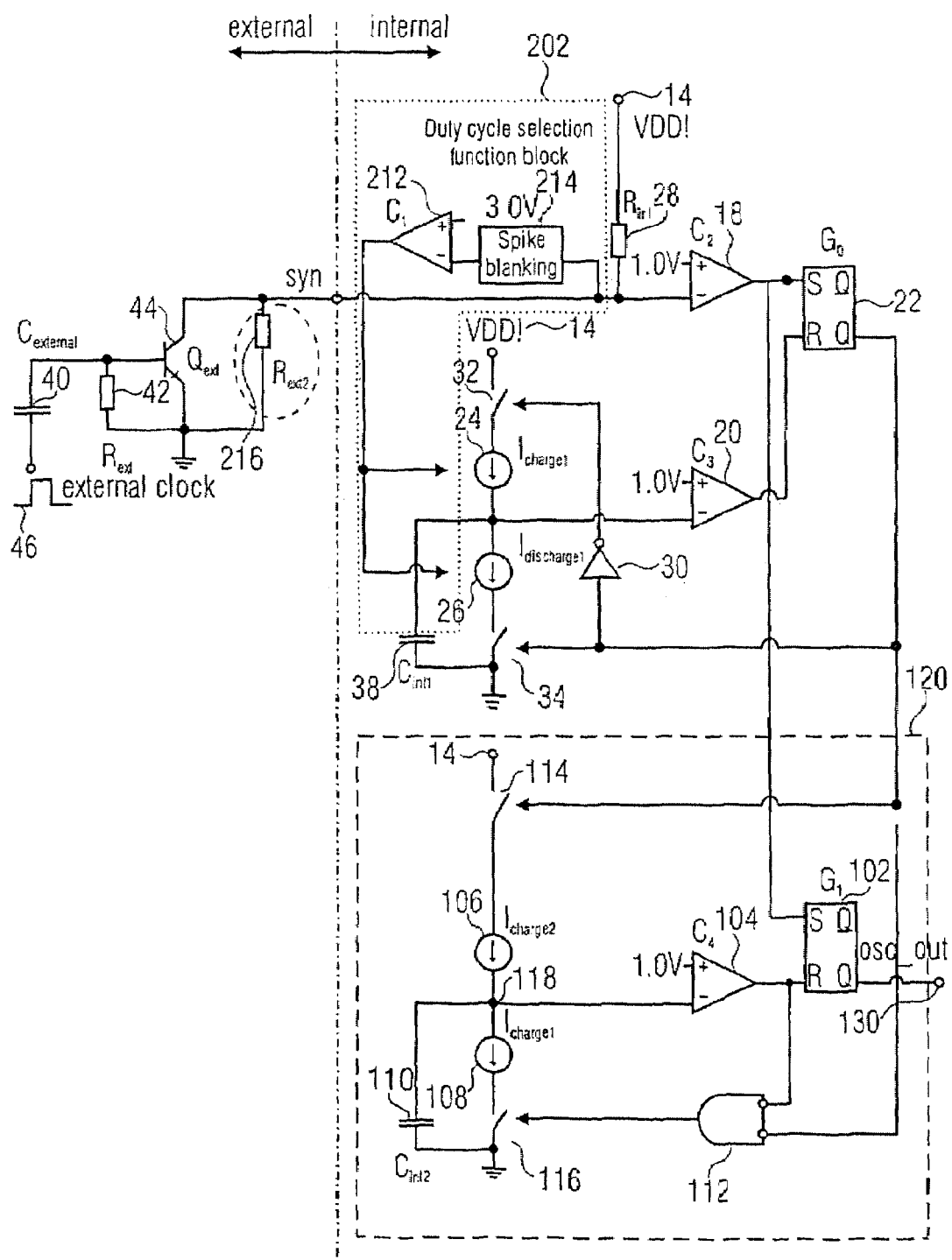
FIG. 6 shows a further embodiment of an oscillator structure.

FIG. 6 shows a further embodiment, allowing to implement two or more duty cycles within one synchronization oscillator which may be selected by external circuitry, in particular by appropriately choosing an external resistor, as will be elaborated in more detail below.

Generally, the oscillator structure 200 of FIG. 6 is based on the oscillator structure 100. Therefore, the same components are marked with the same reference numbers and their functionality will not be explained in the following paragraphs.

In addition to oscillator structure 100, the oscillator structure 200 comprises a sync signal processor (duty cycle selection) 202 to additionally process the sync signal 16. The first and second current sources 24 and 26 of the oscillator structure are adjustable, i.e. they are not limited to the provision of one single predetermined current. The first and second current sources 24 and 26 are implemented such tat they can provide two different currents, i.e. they can be switched between two different operation states, resulting in different currents to be provided.

Figure 7:
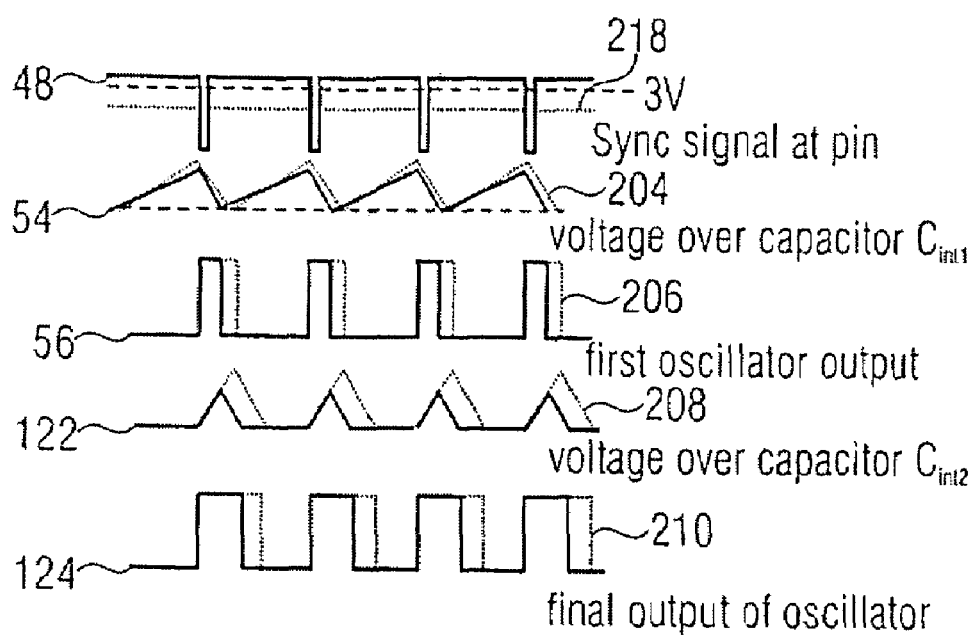
FIG. 7 shows a timing diagram of the further embodiment of the oscillator structure of FIG. 6.

Evidently, as illustrated in FIG. 7, different current levels for the charge and discharge operation of capacitor 38 will result in different duty cycles. As an example, FIG. 7 shows the embodiments of FIGS. 4 and 5 in solid lines, having an alternative mode of operation superimposed in dotted lines. In the example shown in FIG. 5, the charge current of the alternative operation mode is higher, whereas the discharge current is lower than in the mode shown in FIG. 5. Therefore, an alternative second capacitor voltage 204 can be observed at capacitor 38. As shown in FIG. 7, this automatically results in an alternative oscillator output signal 206 and thus also in an alternative second capacitor voltage 208 observable at the second capacitor 110. Consequently, an alternative final oscillation output signal 210 is output at the oscillator output 130. That is, the possibility is provided to select different duty cycles by varying the charge of the first and the second current sources 24 and 26.

According to the embodiment illustrated in FIG. 6, a signal indicating which duty cycle to use can be supplied at the same pin already present for the external clock signal 46, i.e. at the input interface for the signal 16. This is possible, as the sync signal processor analyzes the sync signal to decide upon the currents to be used.

To this end, according to an embodiment, the sync signal processor 202 comprises a fourth comparator 212 and a spike-blanking circuit 214. An input of the spike-blanking circuit 214 is coupled to the input interface for the sync signal 16. An output of the spike-blanking circuit 214 is coupled to the inverting input of the fourth comparator 212, whose non-inverting input is coupled to a predetermined threshold, for example 3.0 V. The spike-blanking circuit 214 serves to eliminate the spikes in the sync signal to provide a constant voltage level signal for the inverting input of the fourth comparator 212. The output of the fourth comparator 212 is coupled to the first and second current sources 24 and 26, which are switched between two different current-provision-modes depending on the state of the signal provided at the output of the fourth comparator 212. That is, when the output of the fourth comparator 212 is low, a first pair of currents will be provided by the first and the second current sources. If the output signal of the fourth comparator 212 is high, a second pair of currents is provided by the first current source 24 and the second current source 26. Evidently, the fourth comparator 212 will switch it's output when the output signal of the spike-blanking circuit 214 crosses the threshold voltage. The voltage level of the sync signal can be adjusted by the application of a single external selection resistor 216 switched between the input interface for the sync signal 16 and external ground.

In this configuration, the internal resistor 28 and the external selection resistor 216 form a voltage divider, defining a constant voltage level observable at the input interface for the sync signal 16. As shown in FIG. 7 and already described for the preceding circuits, the constant voltage level is interrupted by short spikes of decreased voltage, indicating the occurrence of the rising edge of the external clock signal 46. However, the mean voltage level can be adjusted by suitable selection of the external selection resistor 216. As illustrated in FIG. 7, an alternative selection of the selection resistor 216 may lead to an alternative sync signal 218 having a lower constant (mean) voltage level. Therefore, according to the embodiment described in FIG. 6, two different duty cycles may be switched by appropriate selection of the external selection resistor 216. That is, according to this embodiment, different duty cycles may be selected having the additional advantage, that no additional pin has to be provided for a duty cycle selection signal. This is due to the application of the sync signal processor 202 within the oscillator structure 200 shown in FIG. 6.

In other words, a duty cycle selection function is included into an oscillator structure. According to one embodiment, duty cycles can be switched between 63% and 46%. According to a further embodiment, the lower duty cycle stems from interval [10%, . . . 50%]and the upper duty cycle stems from the interval [51%, . . . 95%]. Summarizing, the fourth comparator 212 [C1] is used to set the different duty cycle by comparing the voltage at pin 16 with a threshold voltage (for example, 3 V in FIG. 6). If the voltage at the pin is lower (for example, by attaching an appropriate external selection resistor 216 ($R_{ext,2}$) from pin to ground), the target maximum duty cycle will be 63% and if the voltage is higher, it is 46%. The output of the fourth comparator 212 is connected to switches selecting one set of charging current and discharging current for capacitor 38 ($C_{int1}$), i.e., one set of charging and discharging current for 46% maximum duty cycle and another set for 63% maximum duty cycle.

In other words, the currents are chosen such that the duty cycle of the first oscillator structure will be half of the selected target maximum duty cycle, output by the second oscillator circuit 120. As there is a pulsing sync signal 48 input into the input interfacing for the sync signal 16, a spike-blanking time is used to remove this pulsing signal and maintain a fairly DC value to determine the maximum allowable duty cycle. This functionality is achieved by the spike-blanking circuit 214.

The wave forms shown in FIG. 7 explain how the selection of the maximum duty cycle works. The dotted lines belong to the higher duty cycle. A different set of charging and discharging currents is used for different duty cycles, resulting in a different ramp voltage profile at capacitor 38 ($C_{int1}$). To achieve a higher maximum duty cycle, the maximum ramp voltage at capacitor 38 is set higher by choosing a suitable set of charging and discharging currents so that the duty cycle of the first oscillator circuit will be higher. In this example, the charging and discharging current of the second oscillator circuit 120 is identical, i.e. uninfluenced by the sync signal processor 202. However, the peak voltage at the second capacitor 110 ($C_{int2}$) will be higher for a higher maximum duty cycle because of a higher pulse width of the first oscillator structure.

In this way, the second oscillator structure 120 will double the duty cycle of the first oscillator structure regardless of the duty cycle of the first oscillator structure. Hence, the maximum duty cycle is selected by setting the voltage either lower or higher than the threshold, thereby setting a higher or lower ramp voltage at capacitor 38, resulting in a higher or lower duty cycle of the first oscillator circuit and consequently a higher or lower duty cycle of the oscillator structure 200.

As already mentioned, according to the previously described embodiment, this can be achieved without having to use an additional signaling pin, saving a significant amount of money in production of an oscillating structure 200. Implementing the concept, according to an embodiment, allows to synchronize the internal clock and set the maximum allowable duty cycle and frequency of the oscillator externally. The sync functions used to synchronize the rising edge of the internal oscillator with the rising edge of the external clock, helping to reduce EM1 noise and bulk capacitor ripple.

In a further embodiment, the duty-cycle selection may be implemented to operate continuously, i.e. the charges of the first and the second charge sources may be varied continuously, allowing for a free selection of the duty cycle within a predetermined selection interval. To this end, a sync signal processor 202 is implemented, steering the first and the second current sources 24 and 26 appropriately, to continuously vary the currents produced by the respective current sources.

According to a further embodiment, a multi-threshold implementation is provided, allowing to switch between more than two different current-configurations of the current-sources 24 and 26. This is achieved by comparing the voltage at the input interface for the sync signal 16 with numerous thresholds. If for example, two different thresholds are used, three duty cycles may be selected using the same input interface and different external selection resistors 216. Furthermore, the first and second charge-sources 24 and 26 may not be implemented as to provide varying charges. Instead, numerous current-sources may be implemented, each being adapted to provide one single current. For the variation of the duty cycle, different current sources may be switched on and off, as indicated by the sync signal processor 202.

According to a further embodiment, the duty-cycle switching using the same pin mandatory to provide the synch-signal may also be implemented into an oscillator structure as shown in FIG. 1, i.e. without the duty-cycle doubling of FIG. 6. Moreover, the concept of providing a switching capability using the same pin already provided for external clock or sync signal may be implemented to any other integrated circuit or device operated with an external clock or sync signal.

In addition to oscillator structures synchronized with an external clock signal, oscillator structures comprising an additional internal oscillator not synchronized with an external clock are known. These oscillator structures may, therefore, oscillate with a different oscillation frequency, such that the possibility is provided to either have an oscillator signal at the output of such an oscillator structure having an internally predetermined frequency or having the frequency of the an external clock signal. Such oscillator structures therefore need to have additional circuitry for switching between two different oscillators implemented.

Figure 8:
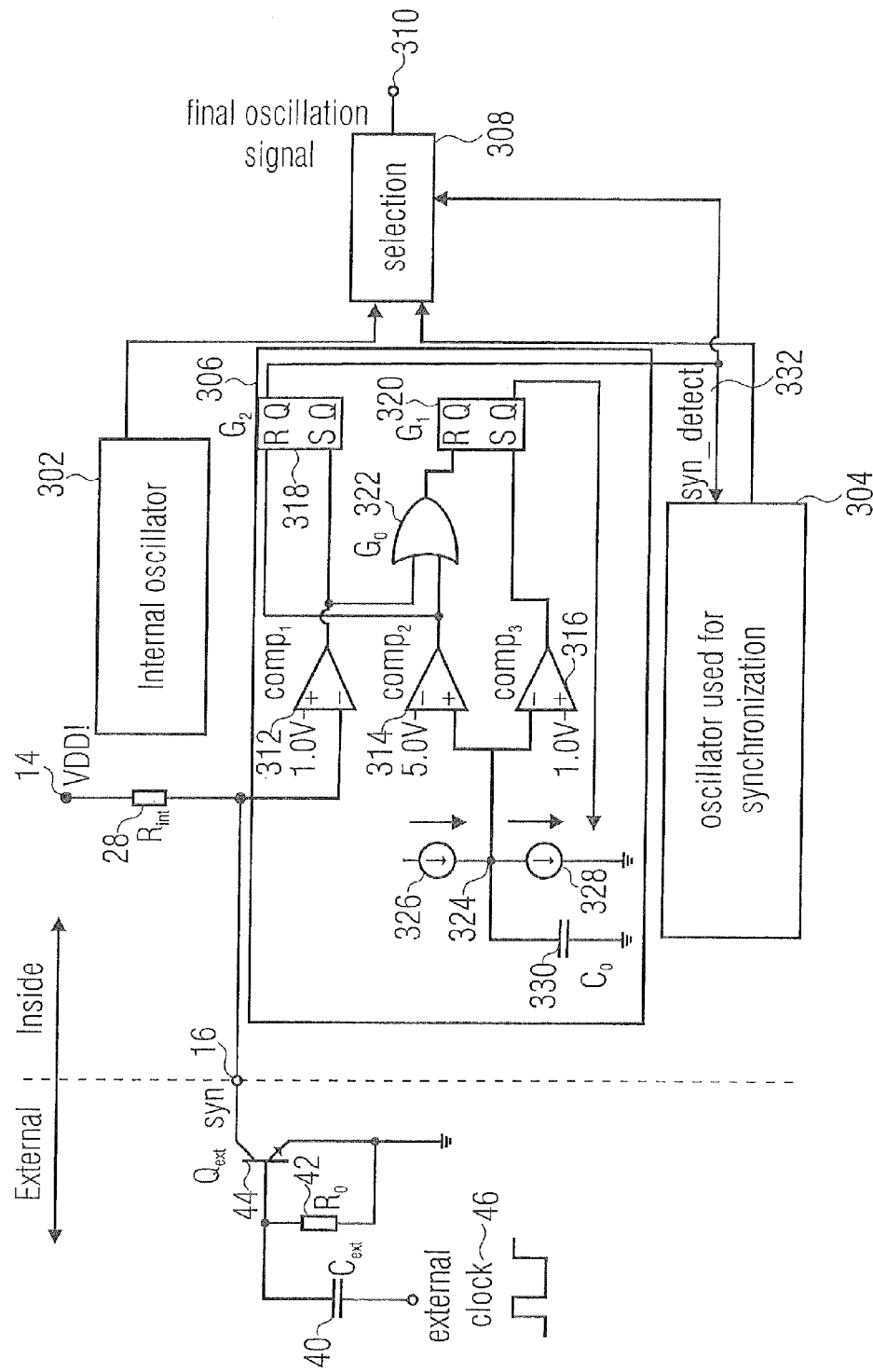
FIG. 8 shows an example of an oscillator structure comprising two oscillators.

FIG. 8 shows an example of an oscillator structure comprising an internal oscillator 302 oscillating at fixed frequency and a synchronized oscillator 304 oscillating with the frequency of an external clock signal. To be able to switch between the two oscillators, the oscillator structure in FIG. 8, according to an embodiment, furthermore comprises an oscillator selection circuit 306 detecting the presence of the sync signal and to provide for this sync signal to be input into the synchronized oscillator 304. When the external clock signal 46 is not present, oscillator selection circuit 306 indicates the use of the internal oscillator, as elaborated in more detail below.

Figure 9:
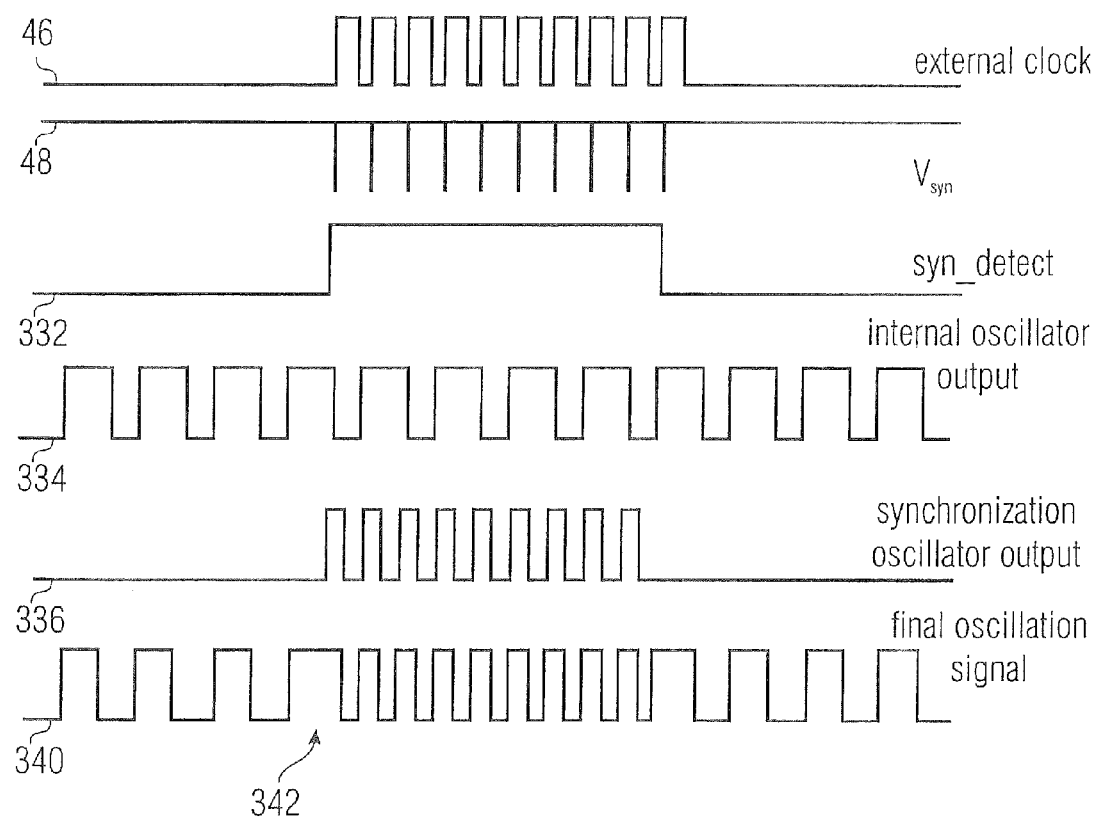
FIG. 9 shows a timing diagram of the example of the oscillator structure of FIG. 8.

In the example of an oscillator structure shown in FIG. 8, the external circuitry is equivalent to the external circuitry already described with the previous figures, therefore the generation of the sync signal will not be detailed. However, the timing diagram of FIG. 9 illustrates the general operation of the oscillator structure of FIG. 8. The functionality of the oscillator structure of FIG. 8 will therefore be described referencing the wave forms or the timings illustrated in FIG. 9.

Both the internal oscillator 302 and the synchronized oscillator 304 have oscillator outputs coupled to signal selection element 308, which switches either the input of the synchronized oscillator or the input of the internal oscillator to it's output for providing a final oscillation signal at an oscillator structure output 310 of the oscillating structure. Therefore, the signal selection element 308 has a further input for a synchronization detection signal, indicating the oscillator to be used.

According to an embodiment, the oscillator selection circuit 306 comprises a fifth comparator 312, a sixth comparator 314 and a seventh comparator 316. The oscillator selection circuit 306 furthermore comprises a third flip-flop 318 and a fourth flip-flop 320. The inverting input of the fifth comparator 312 is coupled to the input interface for the sync signal 16. The non-inverting input of the fifth comparator 312 is coupled to a first reference voltage, for example 1.0 V. The output of the fifth comparator 312 is coupled to the "set"-input of the third flip-flop 318 and furthermore to a first of two inputs of an or-gate 322. The non-inverting output of the third flip-flop 318 is coupled to a synchronization detection input of the synchronized oscillator 304 and to the synchronization detection input of the signal selection element 308. The reset input of the third flip-flop 318 is coupled to the output of the sixth comparator 314, which is furthermore coupled to the second input of the or-gate 322. The inverting input of the sixth comparator 214 is coupled to a second reference voltage, for example 5.0 V. The non-inverting input of the sixth comparator 314 is connected with the inverting input of the seventh comparator 316 and a charge summation point 324. A fifth current source 326 is switched between operating voltage and the charge summation point 324 and a sixth current source 328 is switched between the charge summation point 324 and ground. An integration capacitor 330 is switched between ground and the charge summation point 324.

Evidently, upon occurrence of the first external clock signal, the fifth comparator 312 sets the third flip-flop 318 as the output of the fifth comparator 312 will be high during the duration of the voltage drop of the sync signal. Therefore, upon first occurrence of the external clock signal, a synchronization detection signal 332, observable at the non-inverting output the third flip-flop 318 will be switched to the "high"-state. Upon occurrence of the sync signal, the fourth flip-flop 320 is reset via the or-gate 322. The signal of the inverted output of the fourth flip-flop 320 is used to alternately switch on and off the fifth current source 326 and the sixth current source 328 to charge or discharge integration capacitor 330. That is, when the external clock signal 46 is present, the voltage of the integration capacitor 330 charges and discharges around a threshold of 1.0 V, i.e. the mean voltage is 1.0 V.

If, however, no external clock signal follows the preceding one to reset the fourth flip-flop 320, the integration capacitor 330 will be charged until exceeding the voltage level (5.0 V) of the fifth comparator 314. That is, the third flip-flop 318, providing the synchronization detection signal 332 is reset and the voltage of the integration capacitor 330 will vary around a mean level of 5.0 V, until the next clock signal is detected. That is, the synchronization detection signal 332 is in a high state while the external clock signal is applied and in a low state when the external clock signal is not applied, as illustrated in FIG. 9.

The internal oscillator 302 oscillates at a predetermined internal oscillation frequency, as indicated by the internal oscillator output 334. To the contrary, the synchronized oscillator 304 oscillates at the frequency of the external clock signal, as illustrated by the synchronized oscillator output signal 336. The signal selection element 308 receives the internal oscillator output signal 334 and the synchronized oscillator output signal 336 together with the synchronization detection signal 332 and switches the synchronization oscillation output signal 336 to the oscillator structure output 310 to replace the internal oscillator output signal 334, when the external clock signal 46 is present. Thus, an oscillator structure output signal 340 as shown in FIG. 9 is be observed at the oscillator structure output 310.

As indicated in FIG. 9, the signal selection element 308 switches the output the very moment the first rising edge of the external clock signal occurs. As the internal oscillator output and the external clock signal are not synchronized with each other by any means, a duty cycle at the time of transition may be much longer than the duty cycles of the individual oscillators. This is, for example, illustrated in transition position 342 of FIG. 9, where the synchronization oscillator output signals 336 and the internal oscillator output signal 334 are concatenated such, that the duty cycle at the time of transition is much higher than 50%, which is roughly the duty cycle of the internal oscillator output signal 334 as well as the synchronization oscillator output signal 336.

Figure 10:
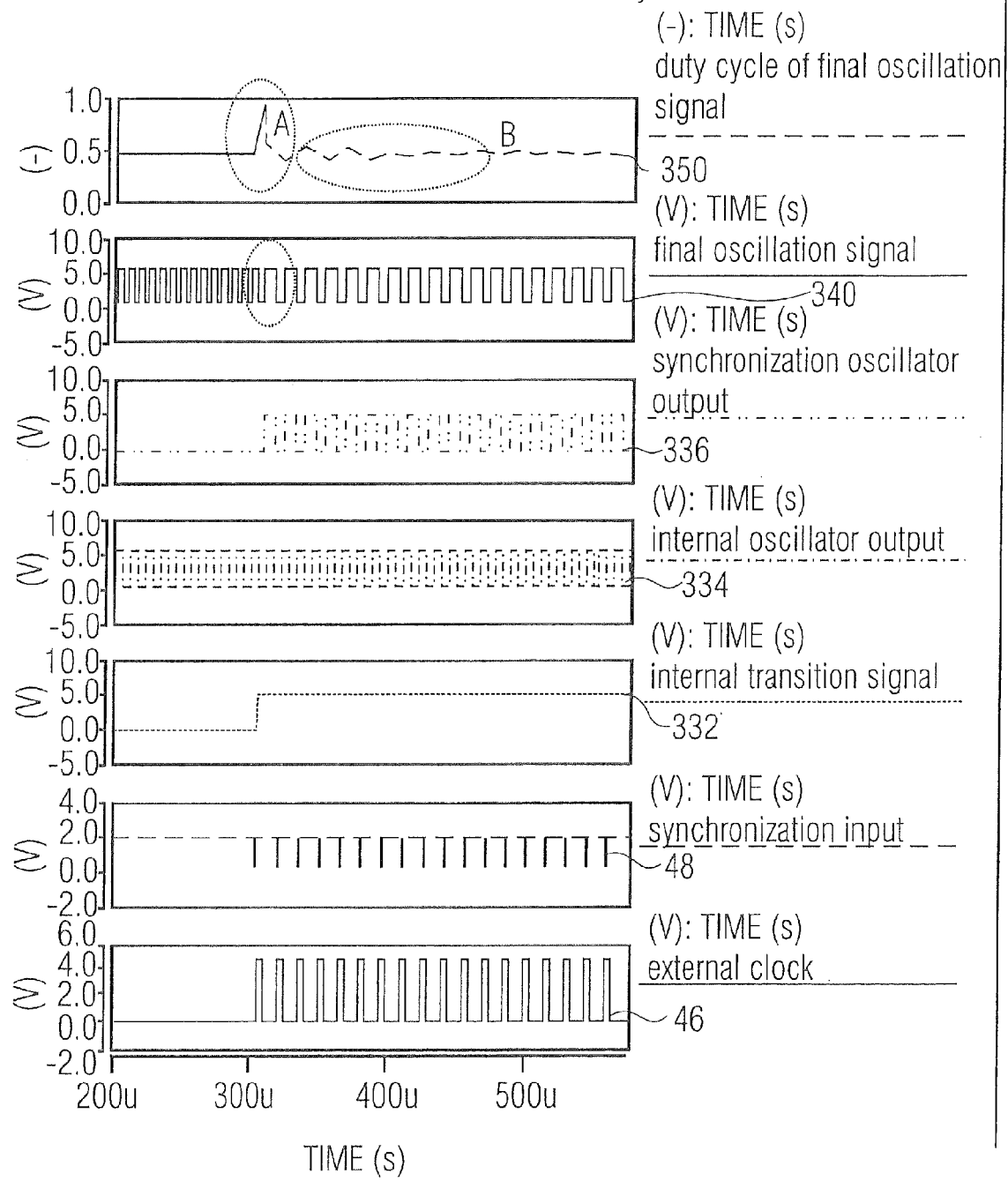
FIG. 10 shows a further timing diagram of the example of the oscillator structure of FIG. 8.
Figure 11:
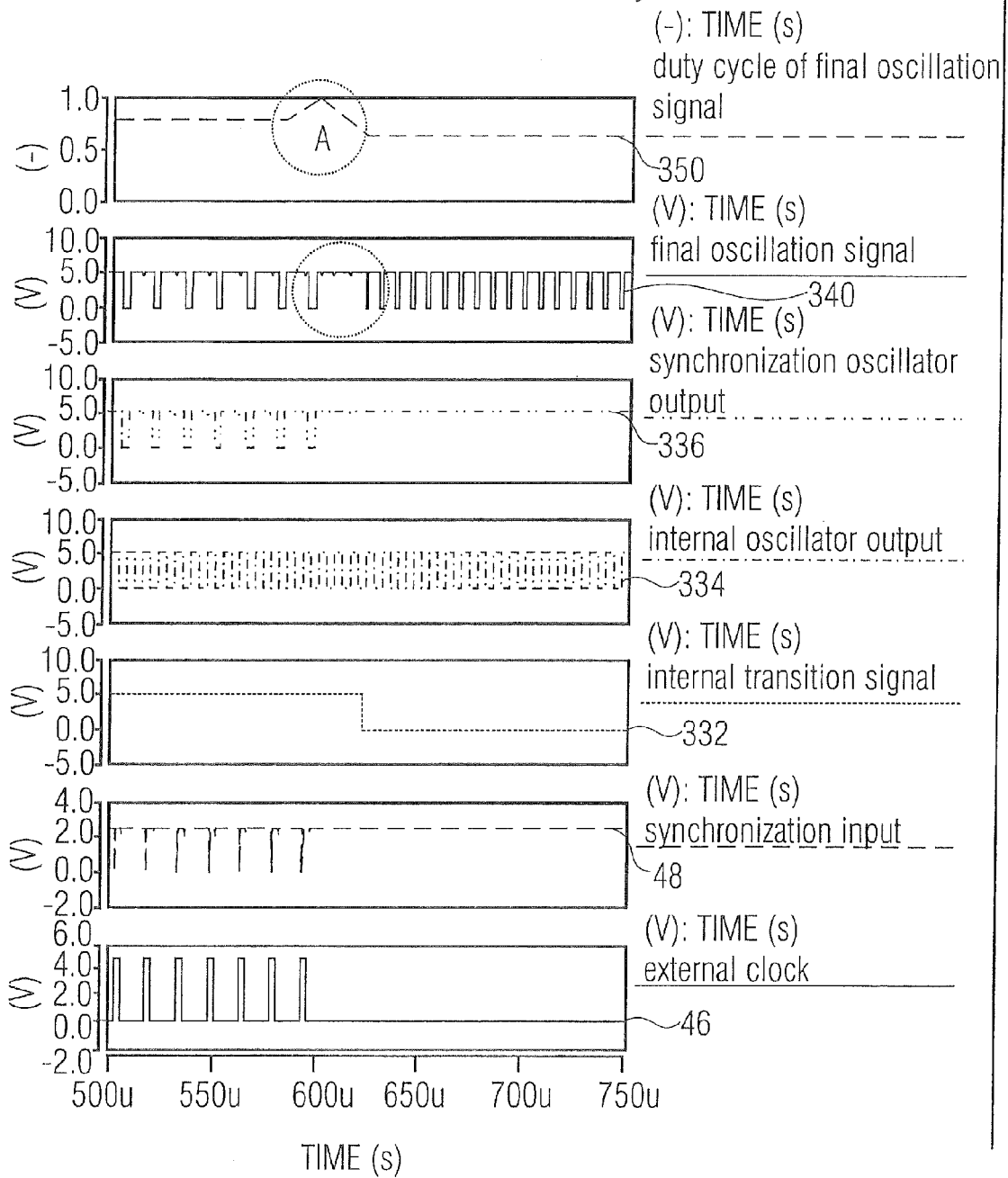
FIG. 11 shows another timing diagram of the oscillator structure of FIG. 8.

FIGS. 10 and 11 show further measurement results, describing a distortion of the duty cycle and the oscillator structure output signal 340, when transiting from the internal oscillator output signal 334 to the synchronized oscillator output signal 336 or vice versa. As already shown in FIG. 9, the internal oscillator will provide the final oscillation signal, when there is no synchronization signal present and the frequency of the final oscillation signal is fixed. The synchronization oscillator will not have any sync signal, therefore it is not oscillating. When there is a synchronization signal present, the synchronization oscillator output will oscillate with the same frequency as the frequency of the external clock and a duty cycle depending on the internal synchronization oscillator circuit. The internal oscillator is still working, but does not provide any signal contribution to the final oscillation signal.

The transition from the synchronization oscillator to the internal oscillator or from the internal oscillator to the synchronization oscillator is performed automatically, depending on the presence of an external clock signal. However, the wave forms shown in FIG. 9 are only representing an ideal case. Actually, transitions from the internal oscillator to the synchronization oscillator or from the synchronization oscillator to the internal oscillator, when measured, show further distortions. FIGS. 10 and 11 show the same signals already explained for FIG. 9 and a duty cycle signal 350, indicating the duty cycle of the oscillator structure output signal 314.

FIG. 10 illustrates the transition from the internal oscillator output signal 334 to the synchronization oscillator signal 336. During transition (A) one pulse duty cycle is too high, in particular up to almost 1.0. Such a high duty cycle would, for example, not be acceptable for a switching mode power supply, because having such a high duty cycle would mean that the power MOS would be switched on for a very long time, possibly destroying the power MOS. Furthermore, the synchronization oscillator 304 encounters instability problems (regarding the duty cycle) just after the transition, that is, right after starting operation. This may furthermore introduce an instability into a switching mode power supply system.

FIG. 11 shows an example for the transition from the synchronization oscillator output signal 336 to the internal oscillator output signal 334. Again, during transition (A) one pulse duty cycle is too high, being up to almost 1.0. As already mentioned, this is not acceptable for a switching mode power supply, the reasons being the same as set forth above.

Therefore, an oscillator structure, assuring that instabilities in the duty cycle can be avoided, when switching between internal oscillators, is desirable.

Figure 12:
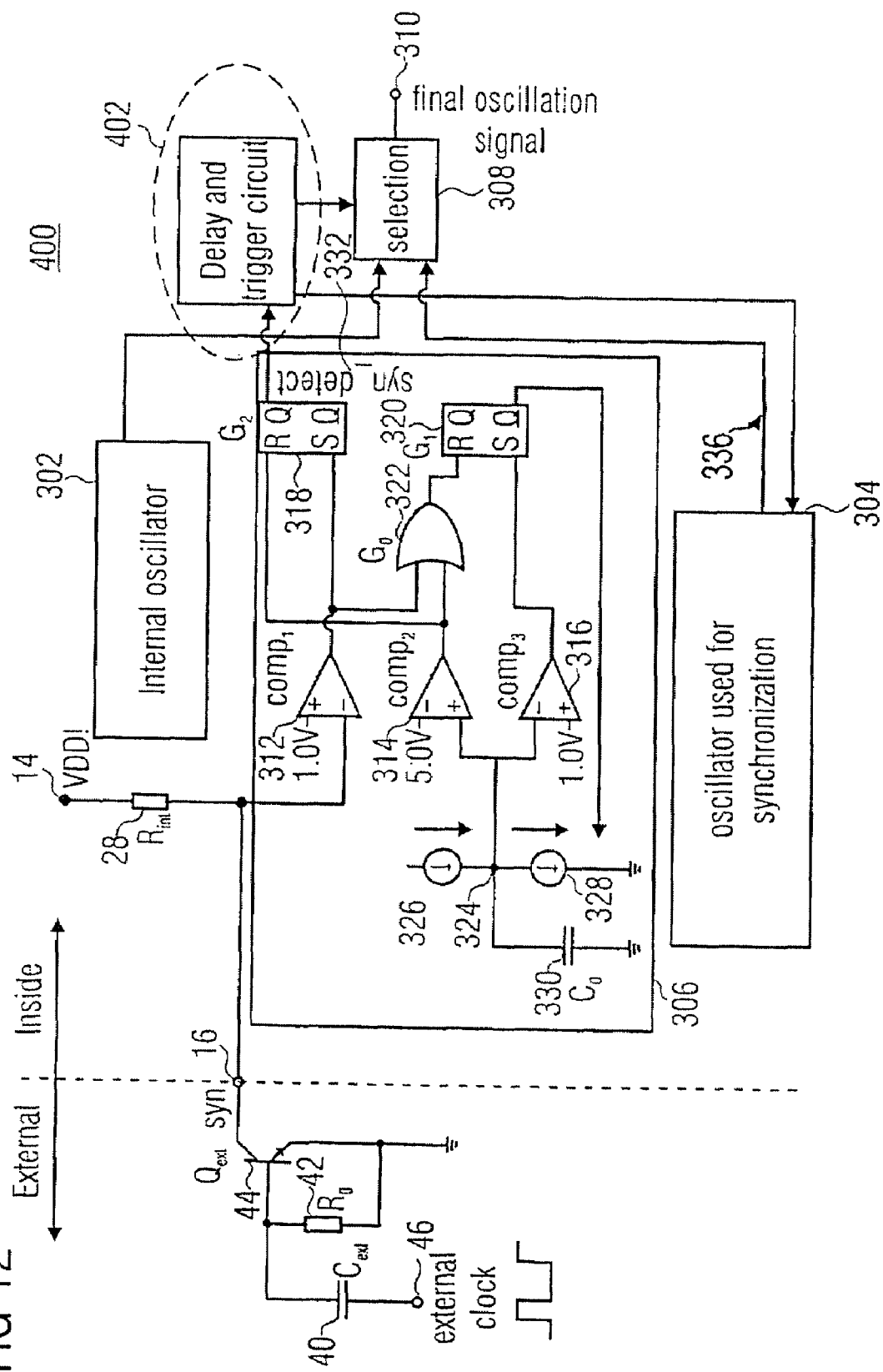
FIG. 12 shows a further embodiment of an oscillator structure.

FIG. 12 shows an oscillator structure 400 as a further embodiment. The oscillator structure 400 has a switching time calculator 402 comprising an input interface for the synchronization detection signal 332 and an output interface for a transition time signal and an output coupled to the signal selection element 308 and the synchronized oscillator 304. The switching time calculator 402 comprises a delay and trigger functionality. A delay may be provided to let the synchronization oscillator output signal 336 be stabilized. A trigger functionality is implemented, to assure that the transition between the individual oscillators happens at the right time, as it will be explained below.

FIG. 12 shows a flexible oscillator structure 400 as a further embodiment. The flexible oscillator structure 400 has a switching time calculator 402 comprising an input interface for the synchronization detection signal 332 and an output interface for a transition time signal and an output coupled to the signal selection element 308 and the synchronized oscillator 304. The switching time calculator 402 comprises a delay and trigger functionality. A delay may be provided to let the synchronization oscillator output signal 336 be stabilized. A trigger functionality is implemented, to assure that the transition between the individual oscillators happens at the right time, as it will be explained below.

The switching time calculator 402 may be used to additionally apply a delay before signaling to the signal selection element 308, that the signals have to be switched from the internal oscillator 302 to the synchronized oscillator 304.

According to one embodiment, this feature is included to allow for a stabilization of the synchronized oscillator 304 prior to forwarding the synchronized oscillator output signal 336 to the oscillator structure output 310.

Furthermore, according to some embodiments, a trigger functionality may be implemented, making sure that the transition time is chosen such that the concatenation of the synchronized oscillator output signal 336 and the internal oscillator output 334 is avoided, when both signals are high state. This effectively avoids the occurrence of a duty cycle being longer than the duty cycle of the individual oscillators.

Figure 13:
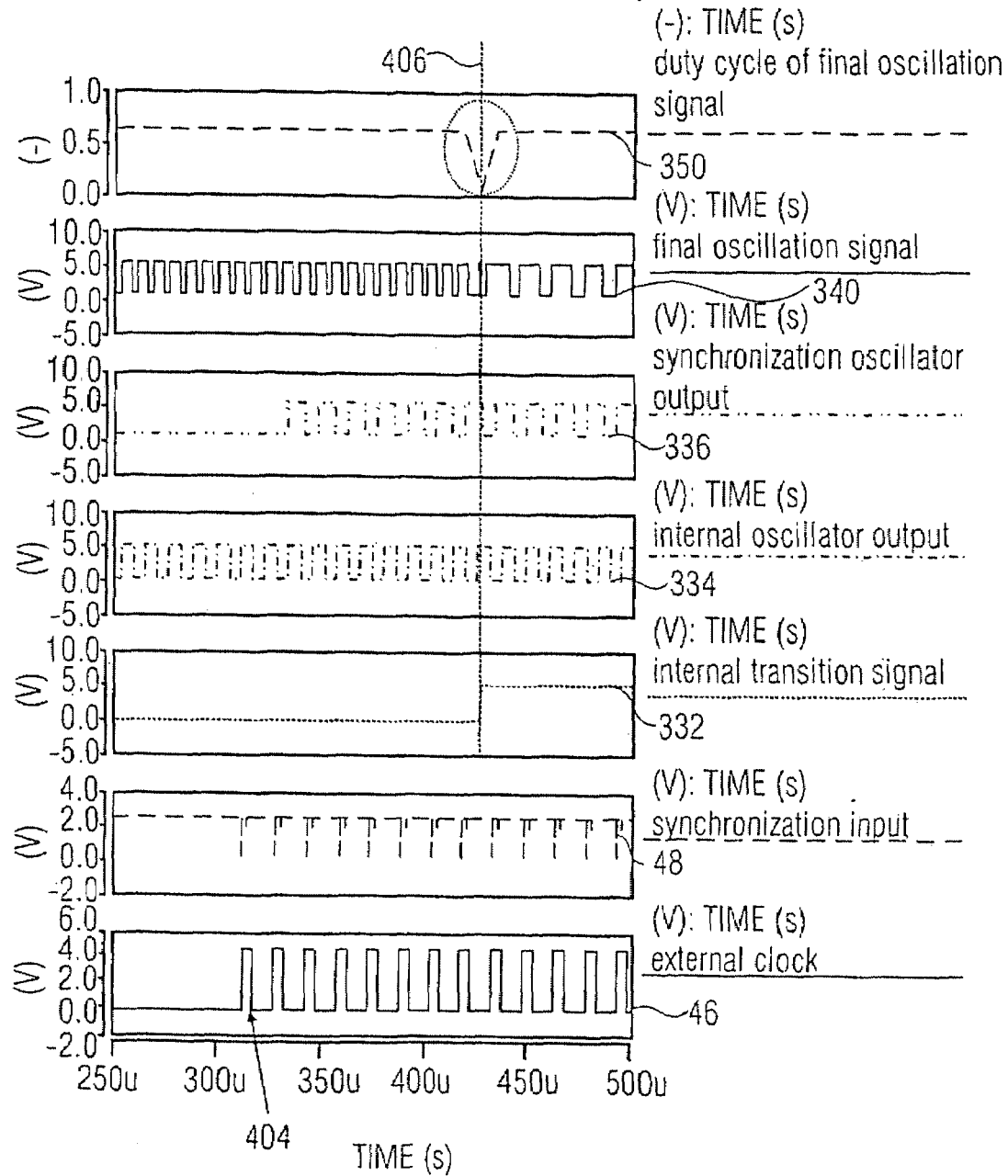
FIG. 13 shows a timing diagram for the oscillator structure of FIG. 12.
Figure 14:
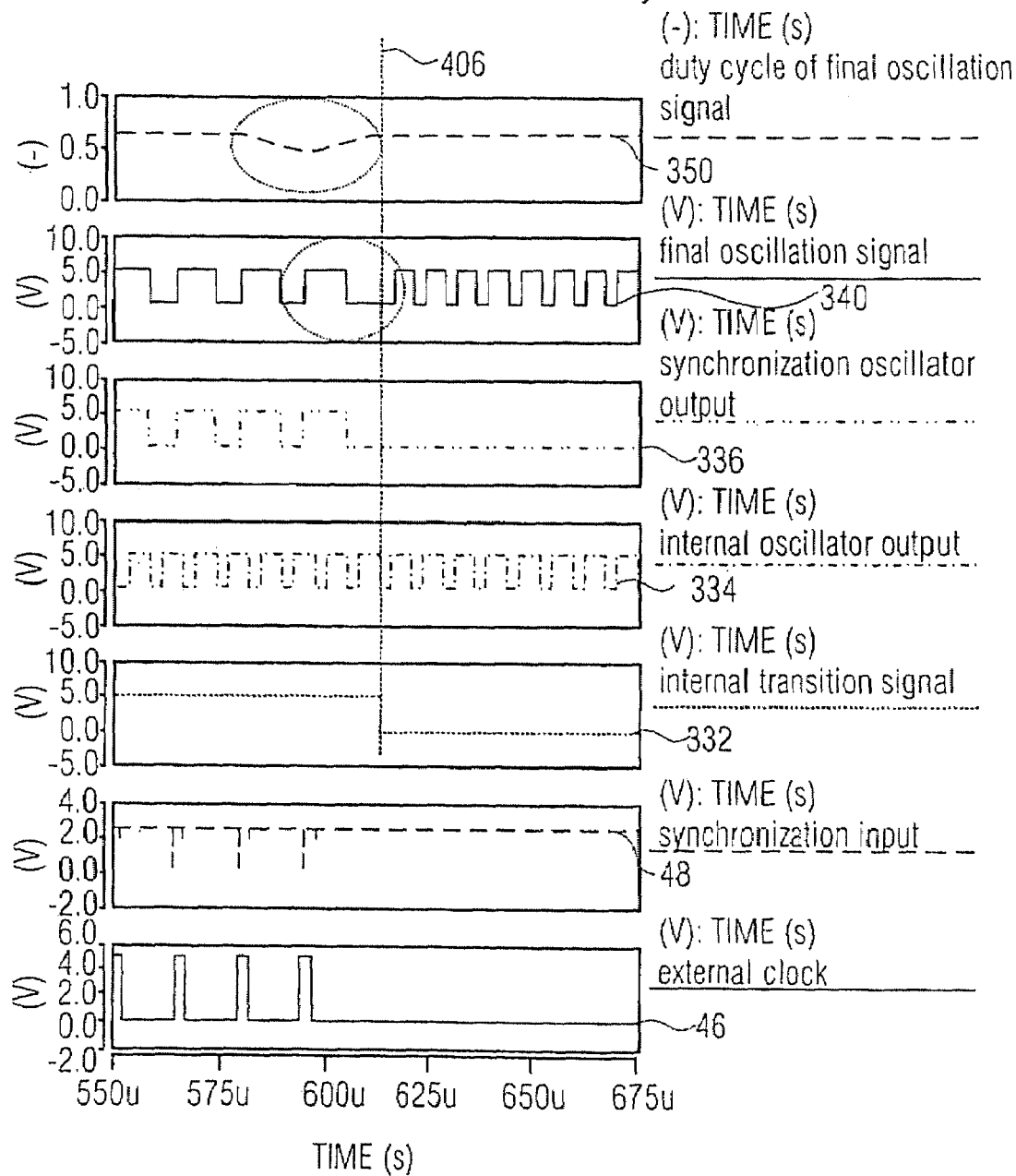
FIG. 14 shows a further timing diagram for the oscillator structure of FIG. 12.

FIGS. 13 and 14 explain the functionality of the switching time calculator 402 in detail.

FIG. 13 shows the transition of the internal oscillator output signal 334 to the synchronization oscillator output signal 336 according to an embodiment. FIG. 13 illustrates the delay and trigger functionality. As can be seen, a clock occurrence time 404 is well before the synchronization detection signal 332 is provided for the signal selection element 308. The application of this delay has the positive effect of allowing the synchronization oscillator signal 336 to stabilize before it is forwarded to the oscillator structure output signal 310. As such, the distortions induced by a not yet stabilized synchronization oscillator output signal 336 right after the clock occurrence time 404 can be avoided.

Furthermore, a trigger functionality of the switching time calculator 402 calculates the switching time 404 such that the synchronization oscillator output signal 336 is switched to the oscillator structure output signal 340 when it is in low state, thus effectively avoiding the occurrence of a duty cycle which is higher than the duty cycles of the individual oscillator signals. Hence, according to the embodiment illustrated in FIG. 12, a stable transition can be achieved, avoiding disturbances in the duty cycle during transition.

FIG. 14 illustrates the functionality of the switching time calculator 402 when transiting from the synchronization oscillator output signal 336 to the internal oscillator output signal 334. FIG. 14 particularly shows the trigger functionality, as the switching time 406 is calculated by the switching time calculator 402 such that the signal to be switched to starts with a falling edge (in this case the internal oscillator output signal 334). This is achieved by an additional delay added to the time when the missing of the external clock signal 46 is detected, such as to achieve the trigger feature.

In other words, the switching time calculator 402 adds some delay to the time, when the synchronization signal comes into the switching time calculator 402 to provide a switching signal (internal transition signal 332) indicating the transition from the internal oscillator output signal 334 to the synchronization oscillator output signal 336. Furthermore, a trigger functionality (trigger circuit) makes sure, transition happens at a certain time. For example, from internal oscillator 302 to synchronized oscillator 304, the transition signal (switching time 406) should be selected at the time when the synchronization oscillator output signal 336 has a falling edge. Transition from synchronized oscillator 304 to internal oscillator 302 should be timed such that the transition signal (synchronization detection signal 332) is switched when the internal oscillator output signal 334 has a falling edge.

In other words, by using a switching time calculator 402 it is ensured that the oscillator structure output signal 340 remains stable, having a duty cycle always within the desired specification, thus allowing for a switching mode power supplies to work in a safe an stable working condition.

It goes without saying that the switching time 406, according to other embodiments, may be calculated differently than proposed in the previous paragraphs, if it can be assured, that the duty cycle will not exceed a predetermined threshold. Therefore, according to a further embodiment, a switching time calculator 402 is used, calculating the switching time such that the duty cycle of an oscillator structure output signal remains below a predetermined threshold. This threshold may even be higher than the duty cycles of the individual oscillator structures to be switched between, i.e. the internal oscillator and synchronized oscillator.

Furthermore, the switching strategy according to the embodiment may be applied to any further implementation requiring to switch appropriately between different oscillators. Moreover, the different oscillators to be switched between do not necessarily have to be integrated into a single chip or IC or the like. According to a further embodiment, a switching time calculator is implemented as a discrete circuit element, as an IC or the like.

Figure 15:
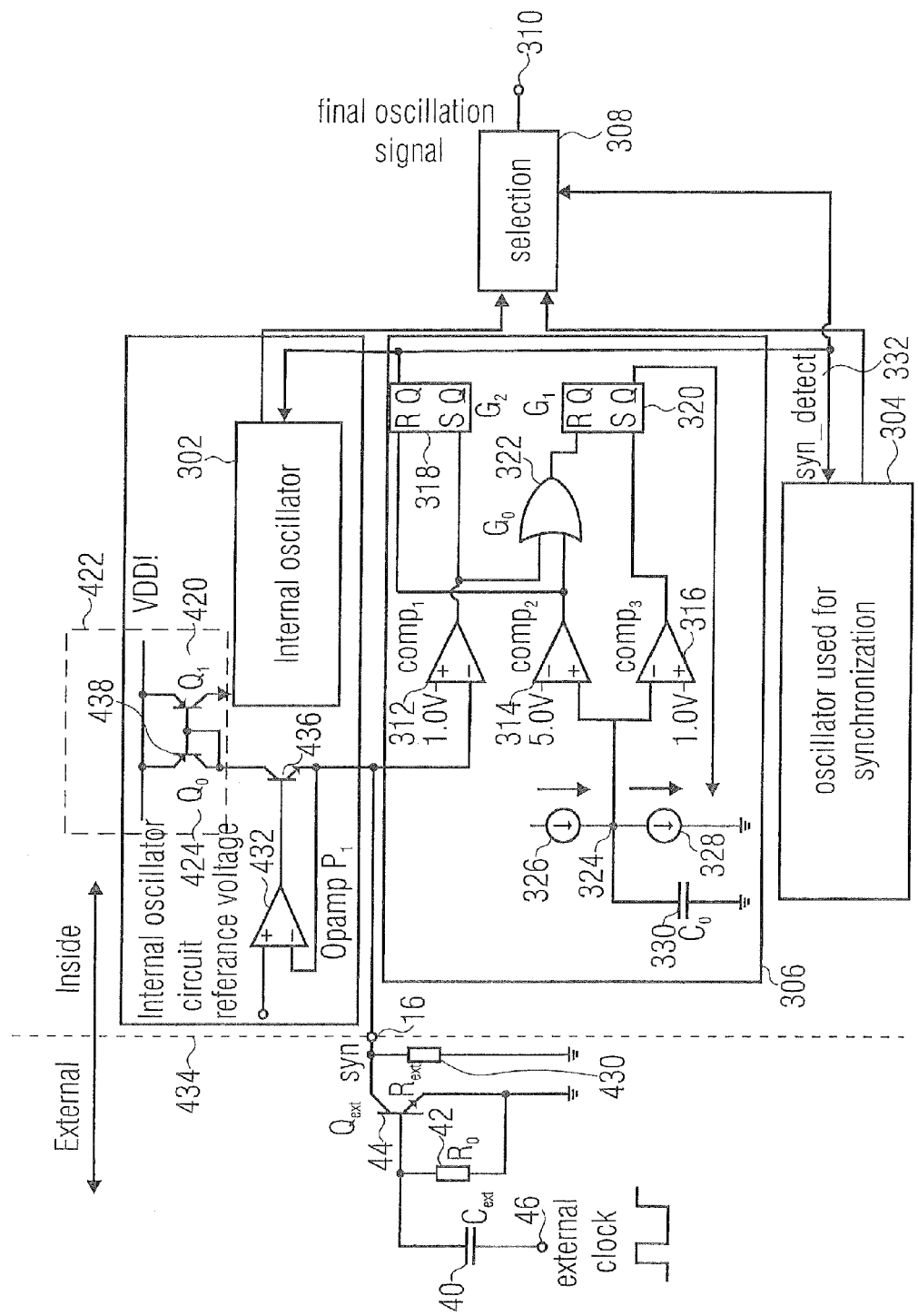
FIG. 15 shows a further example of an oscillator structure.

Oscillator structures are known, comprising an internal oscillator 302 and a synchronized oscillator 304 as explained in detail in the preceding paragraphs. Furthermore, implementations allowing for the adjustment of the oscillation frequency of the internal oscillator 302 are known. FIG. 15 shows an example of an oscillator structure, comprising an internal oscillator 302 and a synchronized oscillator 304. The oscillator structure of FIG. 15 is similar to the structure of FIG. 8. Hence, the same components share the same reference numbers and the description of FIG. 15 will be restricted to the components not present in FIG. 8.

The oscillation frequency of the internal oscillator 302 can be controlled by a steering current 420 fed into the internal oscillator 302. The steering current 420 is provided by a current mirror 422, that is, the steering current 420 depends on an adjusted current 424 to be mirrored by current mirror 422.

The adjusted current 424 can be influenced by an external current selection resistor 430. To this end, a reference operational amplifier 432 is connected to a reference voltage 434 with its non-inverting input. The inverting input of reference operational amplifier 432 is connected to the input interface for the sync signal 16. The output of the reference operational amplifier 432 is connected to the base of the current transfer transistor 436. The emitter of the current transfer transistor 436 is connected to the input interface for the sync signal 16. The collector of the current transfer transistor 436 is connected to the current mirror 422, in particular to the transistor of the current mirror 422 defining the adjusted current 424. As already described with FIG. 8, transition from the internal oscillator 302 to the synchronized oscillator 304 is performed automatically, depending on the existence of the external clock signal 46.

The reference operational amplifier 432 forces the voltage at the input interface for the sync signal 16 to be approximately the reference voltage. Thus, a current $$I_{ext}=V_{ref}/R_{ext}$$

flows through the current selection resistor 432. Therefore, by varying the resistance of the current selection resistor 430, the current can be adjusted as desired.

This current can only be provided via the current transistor 436 and a primary transistor 438 of the current mirror 422. That is, the adjusted current 424 can be adjusted by the current selection resistor 430, i.e. using only external components. Such, the steering current 420 can be influenced by the selection of the current selection resistor 430 and thus can the oscillation frequency of the internal oscillator 302 be adjusted.

Summarizing FIG. 15, the internal oscillator will work and be output at the oscillator structure output 310, when there is not any synchronization signal present. The internal oscillator current (steering current 420) is decided by external resistor $R_{ext}$. Because there is one operational amplifier inside the chip (reference operational amplifier 432), the current through external resistor should be $$I_{ext}=V_{ref}/R_{ext}$$

After mirroring, this current will provide current for the internal oscillator 302. As such, the oscillation frequency of the internal oscillator 302 will depend on the external resistor (current selection resistor 430). When the external resistor is big, the current source value will be low and the internal oscillation frequency of the internal oscillator 302 will also be low. When the external resistor is small, the current source value will be high and the internal oscillator frequency will be high. Inside the chip, synchronization detection block (oscillator selection circuit 306) is always working to detect if there is any synchronization signal. When there is a synchronization signal (external clock signal 46) applied, the internal oscillator will continue working and the synchronization oscillator will start working and be output instead. However, in order to provide an oscillation structure, it may also be desirable to be able to adjust the duty cycle of the synchronized oscillator 304.

Figure 16:
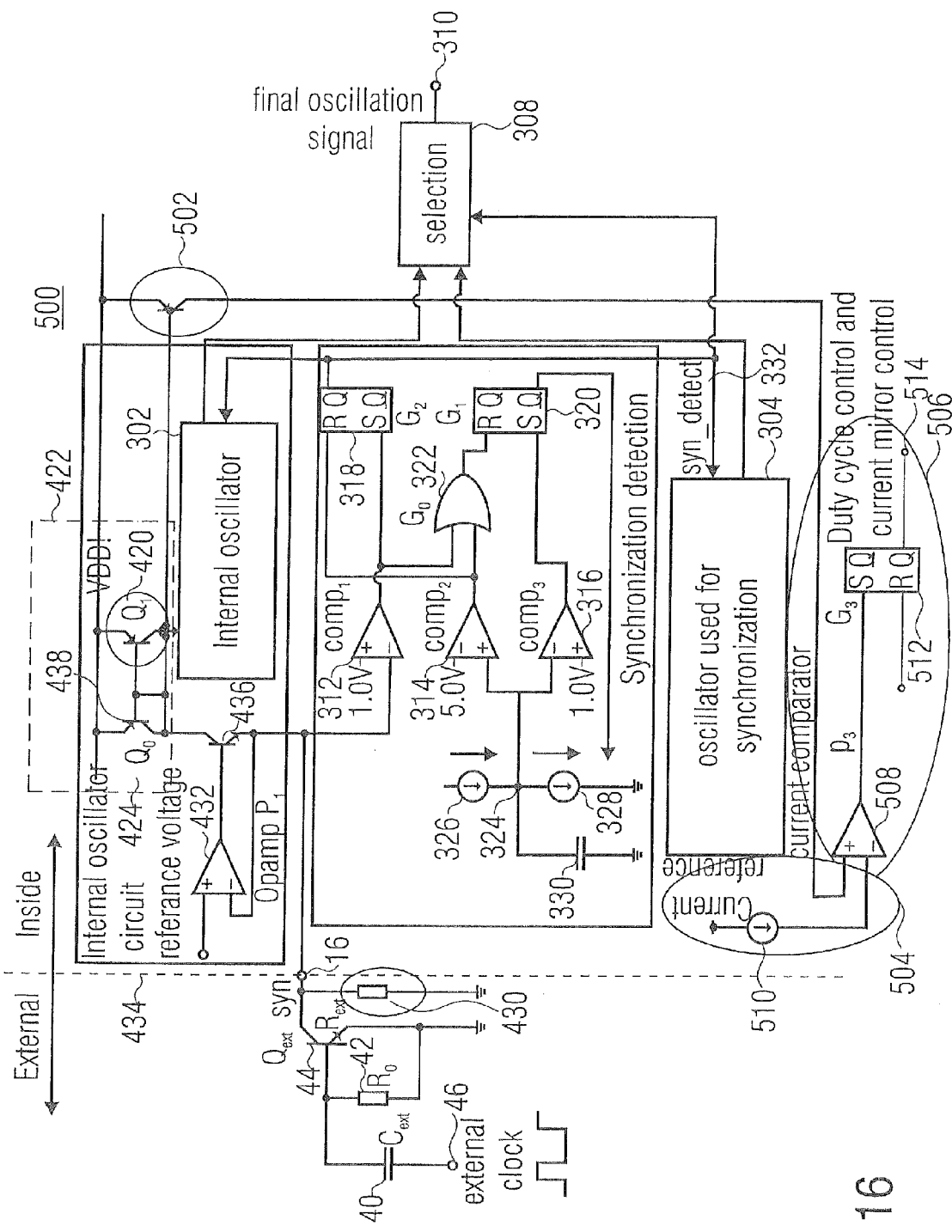
FIG. 16 shows a further embodiment of an oscillator structure.

A further embodiment of an oscillator structure 500 is shown in FIG. 16. The same components shared with the oscillator structure of FIG. 15 are marked with the same reference numbers and their repeated description will be disregarded.

The embodiment of an oscillator structure 500 additionally introduces a sync signal processor circuitry, comprising a current monitoring transistor 502, a current reference circuit 504 and a current comparator 506. As already shown and described in FIG. 15, a variable frequency internal oscillator 302 is used. Applying such an oscillator circuit in a switching mode power supply application may, for example, require an oscillator frequency in-between 60 kHz to 200 kHz, which could, for example, mean an oscillator current to be chosen between 30 µA to 100 µA. Thus, assuming a reference voltage at the input of reference operational amplifier 432 of 2.0 V, a resistor could be chosen between 20 kΩ to 67 kΩ. In other words, other resistor values may not be chosen to not leave the specified range of operation.

According to the oscillator structure 500, the use of a current selection resistor 430 from another resistance range is possible and even desirable to indicate a duty cycle to be used by the synchronized oscillator 304. This is achieved making use of the sync signal processing circuitry, as elaborated in the following paragraphs. To this end, current monitor transistor 502 additionally mirrors the adjusted current 424. For evaluation of the adjusted current 424, the source of the current monitoring transistor 502 is connected to the non-inverting input of a current comparator 508, being part of current comparator circuit 506. The inverting input of the current comparator 508 is connected to a reference current source 510, being part of the current reference circuit 504. When the monitored adjusted current 424 exceeds a predetermined threshold, a current control flip-flop 512, being part of the current comparator circuit 506 is set such as to indicate a current mirror control signal 514 at its non-inverting output.

That is, according to the embodiment of FIG. 16, two input current ranges may be used, which are distinguishable by the sync signal processor circuitry described above. Depending on the state of the current mirror control 514, the synchronized oscillator 304 may either oscillate with a first duty cycle or with a second duty cycle.

Furthermore, it has to be assured that the internal oscillator 302 is not steered with an inappropriate current. This would inevitably be the case for one of the two possible input current ranges. Therefore, the oscillator circuit 500 further uses the current mirror control signal to change the current ratio of the current mirror 422 such, that the internal oscillator 302 will be steered with an appropriate current, no matter whether the adjusted current 424 is within the specification of the input current range of the internal oscillator 302. Thus, for example, current ranges differing by a factor of 5 or 10 can be used, wherein one current input range indicates the use of the first duty cycle and the other current input range indicates the use of the second input cycle. Accordingly, the current mirror ratio of current mirror 422 could, for example, be adjusted to a factor of 5 or 10 such as to provide identical steering currents 420 at the input of the internal oscillator 302.

The following continuation of the preceding example shall again illustrate the concept according to an embodiment. Based on the above example, resistor range 20 kΩ-67 kΩ may be set as default value, such that a current through the current selection resistor 430 will be in between 30 µA-200 µA. Directly mirroring the such adjusted current 424 to the steering current 420 would, for example, lead to a oscillation frequency of the internal oscillator 302 between 60 kHz-200 kHz, wherein the duty cycle of the synchronized oscillator 304 is set at a default value. As an example, the current selection resistor 430 can also be chosen in between 2 kΩ-6.7 kΩ, such that the current through the external resistor will be 200 µA-1 mA. If this current would be supplied to internal oscillator 302 without modification, the variable frequency of the internal oscillator 302 would be within 600 kHz-2 MHz. Such a high frequency would, for example, be unacceptable in switched mode power supply applications.

However, using the previously described sync signal processing circuitry, the high current range can be detected and the current mirror control signal 514 can be used to control current mirror 422 to keep the current provided to the internal oscillator 302 (steering current 420) within 20 µA-100 µA. Hence, the oscillation frequency of the internal oscillator 302 will remain within 60 kHz to 200 kHz. By the same current mirror control signal 514, the duty cycle of the synchronized oscillator 304 can furthermore be controlled. As previously described, current comparator 508 ($P_3$) is used for detection. In the previously described example, a reference current of 250 µA may be chosen. In this example, the current through the external resistor (current selection resistor 430) would be within 30 µA-100 µA, when its resistance is within 20 kΩ. In that case, the output of current comparator 508 will be low and the current mirror control signal 514 provided by current control flip-flop 512 will also be low. The current mirror 422 is left unchanged, such that the oscillation frequency is well within 60 kHz-200 kHz and the duty cycle of the synchronized oscillator 304 is set as default.

If the current selection resistor 430 has a resistance within 2 kΩ-6.7 kΩ, current through the resistor will be within 300 µA-1 mA and the current mirror control signal 514 will be high. Then, for example, the current mirror 422 will be changed to apply a mirroring ratio of 10:1, such that the current provided to the internal oscillator 302 is still within 30 µA-100 µA. However, the duty cycle of the synchronized oscillator 304 can be changed to another value.

As previously described, a property of the sync signal applied to sync signal input 16 which is to be evaluated is a current of the sync signal. As such, a current of a frequency indication signal 420 and a current of the sync signal comprise a first ratio when the current of the sync signal is below a threshold and a second ratio when the current of the sync signal exceeds the threshold.

Figure 17:
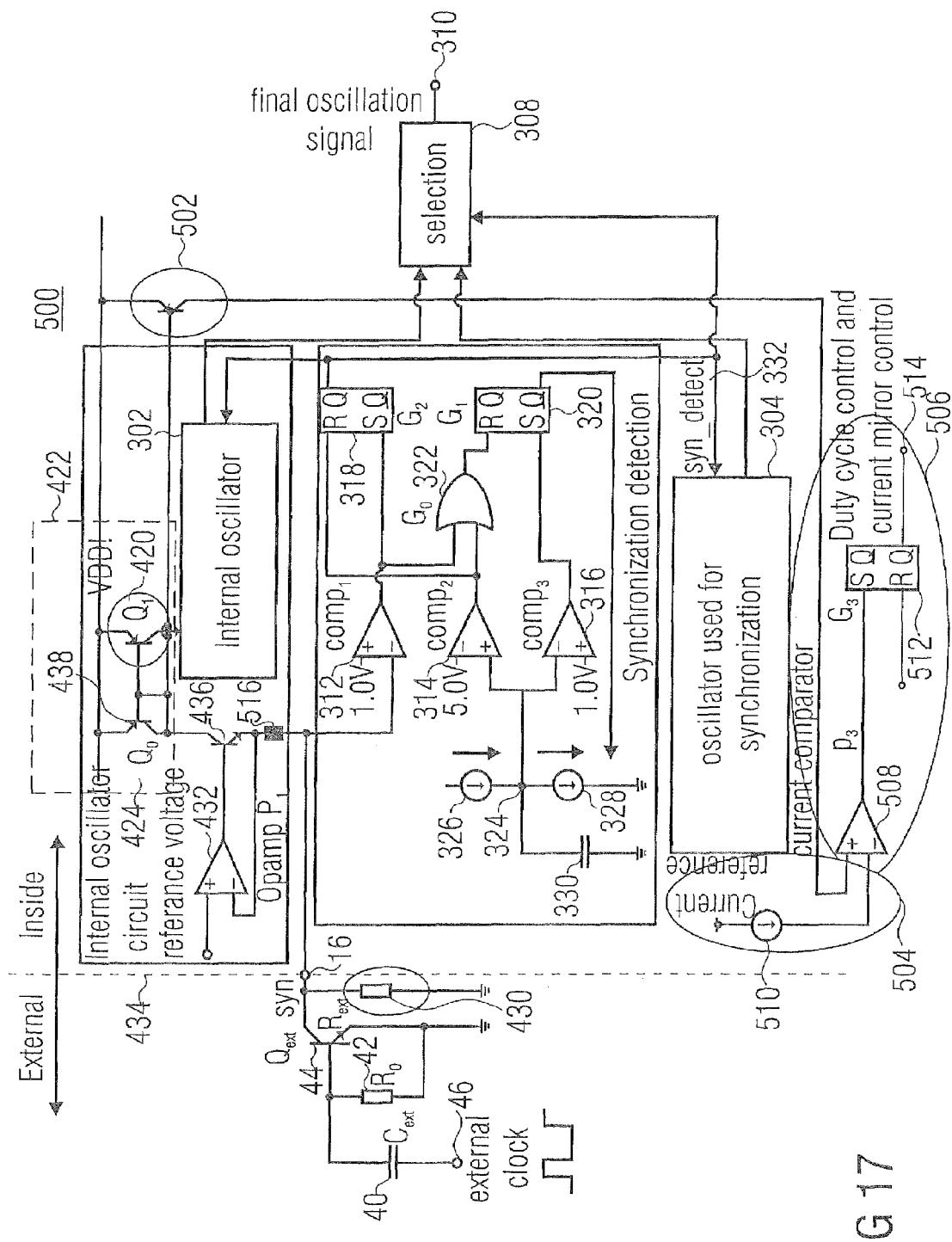
FIG. 17 shows a further embodiment of an oscillator structure.

FIG. 17 shows a further embodiment giving an example as to how to adjust the steering current of the internal oscillator 302. To this end, an internal resistor 516 is switchably connected between current mirror 422 and the input interface for the sync signal 16. Thus, by switching the internal resistor 516 on and off as controlled by the current mirror control signal 514, the steering current to the internal oscillator 302 may be influenced to remain within the appropriate range. Of course, this is only an example as to how such steering can be achieved. Any other way of influencing the current mirror or the steering current directly may alternatively be used to implement the concept according to an embodiment.

In one embodiment, the first ratio between the current of the sync signal and the frequency indication signal is within the interval [0.5, 1.5] and the second ratio is within the interval [5, 15] to allow for a reliable detection.

The oscillator structure 500 has the great advantage, that it does only use one pin of a possible IC-implementation to receive the clock signal, frequency adjustment information for the internal oscillator 302 and duty cycle information for a duty cycle of the synchronized oscillator 304. This unique application of three functionalities into one single pin can further decrease the size of such devices and save a significant amount of money in the production, as to two additional pins can be saved.

That is, duty cycle control is combined with synchronization function and variable frequency adjustment together into one single signal pin.

Although described particularly for an oscillator structure having two oscillators to be switched between, application of three functionalities within one pin, as previously described, may also be applied to other electronic components or ICs operated with an external clock signal 46. That is, also other features of such a device may be switched, as the previously described sync signal circuitry (processor) allows for a digital switch between two states and simultaneously for a continuous adjustment of another quantity while, at the same time, applying an external clock signal 46.

Depending on certain implementation requirements of the methods according to an embodiment, the methods can be implemented in hardware or in software. The implementation can be performed using a digital storage medium, in particular a disk, DVD or a CD having electronically readable control signals stored thereon, which cooperate with a programmable computer system such that the methods are performed. Generally, the present invention can be, therefore, a computer program product with a program code stored on a machine readable carrier, the program code being operative for performing the methods when the computer program product runs on a computer. In other words, the methods can be, therefore, a computer program having a program code for performing at least one of the methods when the computer program runs on a computer.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehended by the claims that follow.

REFERENCE NUMBERS 10 oscillator structure
12 dashed line
14 internal operating voltage
16 input interface for sync signal
18 first comparator
20 second comparator
22 flip-flop
24 first current source
26 second current source
28 internal resistor
30 inverter
32 first switch
34 second switch
36 first connection point
38 capacitor
40 external capacitor
42 external resistor
44 external transistor
46 external clock signal
48 sync signal
50 first comparator output signal
52 second comparator output signal
54 capacitor voltage
56 oscillator output
100 oscillator structure
102 second flip-flop
104 third comparator
106 third current source
108 fourth current source
110 second capacitor
112 end-gate
114 third switch
16 fourth switch
118 second connection point
120 second oscillator circuit
122 second capacitor voltage
124 final oscillator output signal 126 third comparator output voltage
130 oscillator output
200 oscillator structure
202 sync signal processor
204 alternative capacitor voltage
206 alternative oscillator output signal
208 alternative second capacitor voltage
210 alternative final oscillator output signal
212 fourth comparator
214 spike-blanking circuit
216 selection resistor
218 alternative sync signal
302 internal oscillator
304 synchronized oscillator
306 oscillator selection circuit
308 signal selection element
310 oscillator structure output
312 fifth comparator
314 sixth comparator
316 seventh comparator
318 third flip-flop
320 fourth flip-flop
322 or-gate
324 charge-summation point
326 fifth current source
328 sixth current source
330 integration capacitor
332 synchronization detection signal
334 internal oscillator output signal
336 synchronization oscillator output signal
340 oscillator structure output signal
342 transition position
350 duty cycle signal
400 oscillator structure
402 switching time calculator
404 clock occurrence time
406 switching time
420 steering current
422 current mirror
24 adjusted current
430 current selection resistor
432 reference operational amplifier
434 reference voltage
436 current transfer transistor
438 primary transistor
500 oscillator structure
502 current monitor transistor
504 current reference circuit
506 current comparator circuit
508 current comparator
510 reference current source
512 current control flip-flop
514 current mirror control signal
516 internal resistor

What is claimed is:

1. An oscillator structure, comprising:
a sync signal processor comprising an input interface for an external clock based sync signal and an output interface configured to output a duty cycle indication signal depending on a signal property of the sync signal; and
an oscillator comprising an input interface configured to receive the duty cycle indication signal and the sync signal and an output interface configured to output an oscillation signal synchronized with the external clock and having a duty cycle adjusted according to the duty cycle indication signal.

2. The oscillator structure according to claim 1, further comprising:
an internal oscillator comprising an output interface for an oscillation signal having a predetermined duty cycle; and
an oscillator selection circuit comprising an input interface for the sync signal and an output interface for an oscillator selection signal indicating an oscillator to be used.

3. The oscillator structure according to claim 2, wherein the oscillator selection signal indicates the use of the oscillator when the sync signal is present, and wherein the oscillator selection signal indicates the use of the internal oscillator when the sync signal is absent.

4. The oscillator structure according to claim 2, wherein the sync signal processor further comprises an output interface for a frequency indication signal depending on the signal property of the sync signal;
wherein the internal oscillator further comprises an input interface for the frequency indication signal, and wherein the frequency of the oscillation signal of the internal oscillator depends on the frequency indication signal.

5. The oscillator structure according to claim 4, wherein the duty cycle indication signal indicates a first duty cycle when the property of the sync signal is below a predetermined threshold and a second duty cycle when the sync signal exceeds the predetermined threshold, and wherein
the frequency indication signal can indicate the same frequency when the property of the sync signal is below the threshold or exceeding the threshold.

6. The oscillator structure according to claim 5, wherein the property of the sync signal is a current of the sync signal, and wherein a current of the frequency indication signal and the current of the sync signal comprise a first ratio when the current of the sync signal is below the threshold and a second ratio when the current of the sync signal exceeds the threshold.

7. The oscillator structure according to claim 1 wherein the duty cycle indication signal indicates a first duty cycle when the property of the sync signal is below a predetermined threshold and a second duty cycle, when the property exceeds the predetermined threshold.

8. the oscillator structure according to claim 7, wherein the property of the sync signal is a voltage of the sync signal.

9. The oscillator structure according to claim 2, further comprising a switching time calculator comprising an input interface for the oscillator selection signal and an output interface for a transition time signal, such that a combined oscillation signal combined concatenating the oscillation signal of the oscillator or the oscillation signal of the internal oscillator and the oscillation signal of the oscillator indicated by the oscillator selection signal at a time indicated by the transition time signal has a duty cycle below a predetermined duty cycle threshold.

10. The oscillator structure according to claim 9, wherein the duty cycle threshold is the duty cycle of the oscillation signal of the oscillator or the duty cycle of the oscillation signal of the internal oscillator.

11. The oscillator structure according to claim 9, wherein the transition time signal indicates the time of a falling edge of the oscillation signal of the oscillator indicated by the oscillator selection signal.

12. The oscillator structure according to claim 1, wherein the oscillator comprises:
a first oscillator circuit comprising an input interface for the sync signal and an output interface for an intermediate oscillation signal having a duty cycle adjusted according to the duty cycle indication signal; and a second oscillator circuit comprising an input interface for the sync signal and the intermediate oscillation signal and an output interface for the oscillation signal synchronized with the external clock and having a duty cycle adjusted according to the duty cycle indication signal, the oscillation signal synchronized with the external clock depending on the intermediate oscillation signal.

13. The oscillator structure according to claim 12, wherein the oscillation signal synchronized with the external clock comprises an initial active phase and an extended active phase, the initial active phase being synchronized with the sync signal and the extended active phase extending the initial active phase at a time synchronized with a falling edge of the intermediate oscillation signal.

14. An oscillator structure, comprising:

a sync signal processor comprising an input interface for an external clock based sync signal and an output interface configured to output a duty cycle indication signal depending on a signal property of the sync signal; and an oscillator comprising an input interface configured to receive the duty cycle indication signal and the sync signal and an output interface for an oscillation signal synchronized with the external clock and having a duty cycle adjusted according to the duty cycle indication signal, wherein the duty cycle indication signal indicates a first duty cycle when a property of the sync signal is below a predetermined threshold and a second duty cycle when the property exceeds the predetermined threshold.

15. Means for generating an oscillator structure output signal, comprising:

means for processing an external clock based sync signal to derive a duty cycle indication signal depending on a signal property of the sync signal; and oscillating means for receiving the duty cycle indication signal and the sync signal, and for deriving the oscillator structure output signal synchronized with the external clock and having a duty cycle adjusted according to the duty cycle indication signal.

16. A method for generating an oscillation signal, the method comprising:

processing an external clock based sync signal to derive a duty cycle indication signal depending on a signal property of the sync signal;

generating the oscillation signal synchronized with the external clock and having a duty cycle adjusted according to the duty cycle indication signal;

generating an internal oscillation signal having a predetermined duty cycle;

processing the sync signal to derive an oscillation selection signal indicating an oscillation signal to be used; and calculating a switching time, such that a combined oscillation signal combined concatenating the oscillation signal synchronized with the external clock or the internal oscillation signal and the oscillation signal indicated by the oscillation selection signal at the switching time has a duty cycle below a predetermined duty cycle threshold.

17. The method according to claim 16, the method further comprising the steps of:

using the oscillation signal synchronized with the external clock or the internal oscillation signal as the oscillation signal, depending on the oscillation selection signal.

18. The method according to claim 17, the method further comprising the steps of:

indicating the use of the oscillation signal synchronized with the external clock when the sync signal is present; and indicating the use of the internal oscillation signal when the sync signal is absent.

19. The method according to claim 17, the method further comprising the steps of:

deriving a frequency indication signal depending on the signal property of the sync signal; and adjusting the frequency of the internal oscillation signal depending on the frequency indication signal.

20. The method according to claim 19, wherein an oscillation signal synchronized with the external clock having a first duty cycle is derived when the property of the sync signal is below a predetermined threshold and an oscillation signal synchronized with the external clock having a second duty cycle is derived when the sync signal exceeds the predetermined threshold, and wherein the same frequency indication signal can be derived when the property of the sync signal is below the threshold or exceeding the threshold.

21. The method according to claim 16, wherein an oscillation signal synchronized with the external clock having a first duty cycle is derived when the property of the sync signal is below a predetermined threshold and an oscillation signal synchronized with the external clock having a second duty cycle is derived when the sync signal exceeds the predetermined threshold.

22. The method according to claim 16, wherein the switching time is calculated such that the switching time is synchronized with a falling edge of the oscillation signal indicated by the oscillation selection signal.

23. The method according to claim 16, further comprising the steps of:

generating an intermediate oscillation signal having a duty cycle adjusted according to the duty cycle indication signal; and generating the oscillation signal synchronized with the external clock by concatenating an initial active signal phase and an extended active signal phase, the initial active signal phase being synchronized with the sync signal and the extended active signal phase being synchronized with a falling edge of the intermediate oscillation signal.

24. An oscillator system, comprising:

an oscillator structure, comprising:

a sync signal processor comprising an input interface for an external clock based sync signal and an output interface configured to output a duty cycle indication signal depending on a signal property of the sync signal; and an oscillator comprising an input interface configured to receive the duty cycle indication signal and the sync signal and an output interface for an oscillation signal synchronized with the external clock and having a duty cycle adjusted according to the duty cycle indication signal; and a sync signal generator comprising an input interface for the external clock signal and an output interface for the sync signal, wherein the sync signal has a first signal component having a predetermined signal property and a second signal component synchronized with the external clock signal.

* * * * *